US008051352B2

(12) United States Patent
Lin et al.

(10) Patent No.: US 8,051,352 B2
(45) Date of Patent: Nov. 1, 2011

(54) TIMING-AWARE TEST GENERATION AND FAULT SIMULATION

(75) Inventors: Xijiang Lin, West Linn, OR (US);
Kun-Han Tsai, Lake Oswego, OR (US);
Mark Kassab, Wilsonville, OR (US);
Chen Wang, Tigard, OR (US); Janusz Rajski, West Linn, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 611 days.

(21) Appl. No.: 11/796,374

(22) Filed: Apr. 27, 2007

(65) Prior Publication Data

US 2007/0288822 A1 Dec. 13, 2007

Related U.S. Application Data

(60) Provisional application No. 60/796,212, filed on Apr. 27, 2006, provisional application No. 60/859,634, filed on Nov. 18, 2006.

(51) Int. Cl.
*G01R 31/28* (2006.01)
*G06F 11/00* (2006.01)

(52) U.S. Cl. ........................................ 714/738; 714/724

(58) Field of Classification Search ................... 714/738
See application file for complete search history.

(56) References Cited

U.S. PATENT DOCUMENTS

| 4,937,826 | A | * | 6/1990 | Gheewala et al. | ............ 714/724 |
|---|---|---|---|---|---|
| 5,422,891 | A | * | 6/1995 | Bushnell et al. | ............ 714/732 |
| 5,499,249 | A | * | 3/1996 | Agrawal et al. | ................ 714/736 |
| 5,586,203 | A | * | 12/1996 | Spaulding et al. | ............ 382/270 |
| 5,886,900 | A | * | 3/1999 | Gascoyne et al. | ................ 716/6 |
| 6,247,154 | B1 | * | 6/2001 | Bushnell et al. | ............... 714/733 |
| 6,385,750 | B1 | * | 5/2002 | Kapur et al. | ..................... 714/738 |
| 6,408,403 | B1 | * | 6/2002 | Rodrigues et al. | ......... 714/38.11 |
| 6,449,743 | B1 | * | 9/2002 | Hosokawa | ..................... 714/738 |
| 6,697,981 | B2 | * | 2/2004 | Shigeta | .......................... 714/736 |
| 6,799,292 | B2 | * | 9/2004 | Takeoka et al. | ................ 714/726 |
| 6,915,494 | B2 | * | 7/2005 | Shigeta | ............................. 716/4 |
| 7,266,746 | B2 | * | 9/2007 | Hiraide | ......................... 714/738 |
| 7,406,645 | B2 | * | 7/2008 | Nozuyama | ..................... 714/738 |
| 2009/0132976 | A1 | * | 5/2009 | Desineni et al. | .................... 716/5 |

OTHER PUBLICATIONS

Abramovici et al. "Digital System Testing and Testable Design". IEEE Press, 1990.*

(Continued)

*Primary Examiner* — Jeffrey A Gaffin
*Assistant Examiner* — Steve Nguyen
(74) *Attorney, Agent, or Firm* — Klarquist Sparkman, LLP

(57) ABSTRACT

Disclosed herein are exemplary methods, apparatus, and systems for performing timing-aware automatic test pattern generation (ATPG) that can be used, for example, to improve the quality of a test set generated for detecting delay defects or holding time defects. In certain embodiments, timing information derived from various sources (e.g. from Standard Delay Format (SDF) files) is integrated into an ATPG tool. The timing information can be used to guide the test generator to detect the faults through certain paths (e.g., paths having a selected length, or range of lengths, such as the longest or shortest paths). To avoid propagating the faults through similar paths repeatedly, a weighted random method can be used to improve the path coverage during test generation. Experimental results show that significant test quality improvement can be achieved when applying embodiments of timing-aware ATPG to industrial designs.

24 Claims, 14 Drawing Sheets

OTHER PUBLICATIONS

Fuchs et al. "Dynamite: an efficient automatic test pattern generation system for path delay faults", IEEE Transactions on Computer-Aided Design of Integrated Circuits and Systems, 1991.*

Goel, P.; Rosales, B.C.; , "PODEM-X: An Automatic Test Generation System for VLSI Logic Structures," Design Automation, 1981. 18th Conference on , vol., No., pp. 260-268, 29-1 Jun. 1981.*

Barnhart, "Delay Testing for Nanometer Chips," *Chip Design*, 7 pp. (Aug./Sep. 2004).

Carter et al., "Efficient Test Coverage Determination for Delay Faults," *Proc. ITC*, pp. 418-427 (1987).

Gupta et al., "ALAPTF: A New Transition Fault Model and the ATPG Algorithm," *Proc. ITC*, pp. 1053-1060 (2004).

Heragu et al., "Segment Delay Faults: A New Fault Model," *Proc. VLSI Test Symp.*, pp. 32-39 (1996).

"Standard Delay Format Specification, Version 3.0," downloaded from http://www.eda.org/sdf, 104 pp. (document marked May 1995).

Iyengar et al., "Delay Test Generation 1—Concepts and Coverage Metrics," *Proc. ITC*, pp. 857-866 (1988).

Iyengar et al., "Delay Test Generation 2—Algebra and Algorithms," *Proc. ITC*, pp. 867-876 (1988).

Lin et al., "Timing-Aware ATPG for High Quality At-speed Testing of Small Delay Defects," *IEEE Asian Test Symp.*, 8 pp. (Nov. 20, 2006).

Lin et al., "Timing-Aware ATPG for High Quality At-speed Testing of Small Delay Defects," Powerpoint slides from presentation at IEEE Asian Test Symposium, 25 pp. (Nov. 20, 2006).

Liou et al., "Experience in Critical Path Selection for Deep Sub-Micron Delay Test and Timing Validation," *Proc. ASP-DAC*, pp. 751-756 (2003).

Mitra et al., "Delay Defect Screening Using Process Monitor Structures," *Proc. VLSI Test Symp.*, pp. 43-48 (2004).

Park et al., "A Statistical Model for Delay-Fault Testing," *IEEE Design & Test of Computers*, vol. 6, Issue 1, pp. 45-55 (Feb. 1989).

Park et al., "Delay Testing Quality in Timing-Optimized Designs," *Proc. ITC*, pp. 897-905 (1991).

Pomeranz et al., "On $n$-detection Test Sets and Variable $n$-detection Test Sets for Transition Faults," 7 pp. (also published as Pomeranz et al., "On $n$-detection Test Sets and Variable $n$-detection Test Sets for Transition Faults," *Proc. VLSI Test Symp*, pp. 173-180 (1999)).

Sato et al., "Evaluation of the Statistical Delay Quality Model," *Proc. ASP-DAC*, pp. 305-310 (2005).

Sato et al., "Invisible Delay Quality—SDQM Model Lights Up What Could Not Be Seen," *Proc. ITC*, 9 pp. (2005).

Sharma et al., "Finding a Small Set of Longest Testable Paths that Cover Every Gate," *Proc. ITC*, pp. 974-982 (2002).

Smith, "Model for Delay Faults Based Upon Paths," *Proc. ITC*, pp. 342-349 (1985).

Waicukauski et al., "Transition Fault Simulation," *IEEE Design & Test of Computer*, pp. 32-38 (Apr. 1987).

* cited by examiner

ABSTRACT# TIMING-AWARE TEST GENERATION AND FAULT SIMULATION

CROSS-REFERENCE TO RELATED APPLICATIONS

This application claims the benefit of U.S. Provisional Patent Application No. 60/796,212, filed Apr. 27, 2006, and U.S. Provisional Patent Application No. 60/859,634, filed Nov. 18, 2006, both of which are hereby incorporated herein by reference.

FIELD

This application relates generally to the field of generating test patterns for testing integrated circuits.

BACKGROUND

To verify the correct operation of manufactured circuits, it is desirable for the circuits not only to have correct functional behavior, but also to operate correctly at a certain clock frequency (e.g., the operational clock frequency). As logic circuits operate at higher frequencies and as feature sizes shrink, manufactured circuits become more vulnerable to timing-related defects.

Delay fault testing has therefore become a desirable part of integrated circuit testing and can be used to help achieve high test quality. Delay-related defects typically originate from process variations and random defects. Process variations are ordinarily caused by physical parameter variations during the manufacturing process and usually cannot be completely eliminated. Tightly controlling the process variations and adding extra delay margins during the design phase are two common methods to help tolerate process variations. Random delay defects, caused for example by resistive shorts and resistive vias, introduce additional delays and may also cause circuits to malfunction during normal operation.

Various fault models have been proposed to target delay defects. The transition fault model, for instance, considers a gross delay at every gate terminal in the circuit and assumes that the additional delay at the fault site is large enough to cause a logic failure. See, e.g., J. A. Waicukauski, E. Lindbloom, B. K. Rosen, and V. S. Iyengar, "Transition Fault Simulation," *IEEE Design & Test of Computer*, pp. 32-38 (April 1987). Due to the limited fault population with the transition fault model, the model has been widely used in industry. However, transition fault test generation generally ignores the actual delays through the fault activation and propagation paths, and is more likely to detect a fault through a shorter path. As a result, the generated test set may not be capable of detecting small delay defects.

To improve the quality of delay defect test sets such that small delay defects can be detected, it is desirable to integrate timing information into one or more stages of the test generation process.

SUMMARY

Disclosed herein are exemplary methods, apparatus, and systems for performing timing-aware automatic test pattern generation (ATPG) that can be used, for example, to improve the quality of a test set generated for detecting delay defects. In certain embodiments, timing information derived from various sources (e.g. from Standard Delay Format (SDF) files) is integrated into an ATPG tool. The timing information can be used to guide the test generator to detect the faults through certain paths (e.g., paths having a selected length, or range of lengths, such as the longest paths). To avoid propagating the faults through similar paths repeatedly, a weighted random method can be used to improve the path coverage during test generation. Experimental results show that significant test quality improvement can be achieved when applying embodiments of timing-aware ATPG to industrial designs.

Among the features and aspects that can be used alone or in various combinations and subcombinations with each other in embodiments of the disclosed technology are the following:

A fault dropping method to determine if the fault should be removed from the test generation target list so that the testable faults are detected through the longest (or other desirably long) sensitized path. In certain implementations, for instance, the fault drop criterion is when the fault is observed by at least one of the observation points and the slack margin is not larger than a user-specified amount. In some embodiments, the fault drop criterion is when the fault is observed by at least one of the observation points and the slack margin is equal to zero. In other embodiments, the fault drop criterion is when the fault is observed by at least one of the observation points and the slack is not larger than a minimum static slack set by a user-specified number.

A static timing simulation method to compute the arrival time, propagation time, and slack of each pin for an integrated circuit design (e.g., a circuit design with multiple clock frequencies, a design with combinational feedback loops, a design with false paths and multi-cycle paths, or other such design).

A fault-independent timing fault simulation method that computes the actual minimum slack of detected faults of a given pattern (e.g., for a circuit design with multiple clock frequencies, combinational feedback loop, false paths, and/or multi-cycle paths).

A test generation method that detects small delay defects by launching a delay fault (e.g., a transition fault) through one of the sensitizable paths to the faulty site selected by using a weighted random justification decision, and propagating the fault from the faulty site to one of the sensitizable observation points selected by using a weighted random propagation decision. In certain embodiments, the weighted justification decision depends on the static arrival time of a gate input, such that the input with the longer arrival time contains a larger weight and has a higher probability of being selected as part of the justification path. In some embodiments, the weighted propagation decision can depend on the static propagation time of the gate fanout, such that the fanout gate with the longer propagation time contains a larger weight and has a higher probability of being selected as part of the propagation path.

A test generation method for the transition fault model that detects small delay defects by launching the fault through one of the sensitizable paths to the faulty site selected by using a deterministic justification decision, and propagating the fault from the faulty site to one of the sensitizable observation points selected by using a deterministic propagation decision. The deterministic justification decision can depend on the static arrival time of the gate input, and/or on the static propagation time of the gate fanout.

For any of the embodiments, a path delay fault model that does not explicitly enumerate a path can also be used. Instead, the model can implicitly derive the path while performing the test generation and, for example, ensure that one or multiple of the longest (or other desirably long) sensitization paths through the pins are detected. Further, for any of the embodiments, any suitable fault model (such as the as late as possible transition fault (ALAPTF) model) can be used.

In one exemplary embodiment described herein, two or more possible fault propagation paths in an integrated circuit design are identified. The possible fault propagation paths are capable of propagating a fault effect of a targeted delay fault to an observation point in the integrated circuit design. One of the possible fault propagation paths is selected using a weighted random selection procedure. Test pattern values are generated that propagate the fault effect on the selected fault propagation path. The test pattern values can be stored. In some implementations, the weighted random selection procedure favors fault propagation paths with longer path delays over fault propagation paths with shorter path delays. In other implementations, the weighted random selection procedure favors fault propagation paths with shorter path delays over fault propagation paths with longer path delays. In certain implementations, weights are computed for each of the possible fault propagation paths. For example, the computed weight for a respective one of the possible fault propagation paths can indicate the probability that the respective one of the possible fault propagation paths will be selected by the weighted random selection procedure. In particular examples, a weight $w_i$ for a respective possible fault propagation path i is computed as follows:

$$w_i = \frac{PT_i^s}{\sum_{i=1}^{n} PT_i^s},$$

where n is the number of possible fault propagation paths, i is an index value, and $PT_i^s$ is the longest static propagation time for the possible fault propagation path i. In other particular examples, a weight $w_i$ for a respective possible fault propagation path i is computed as follows:

$$w_i = \frac{\frac{1}{HPT_i^s}}{\sum_{i=1}^{n} \frac{1}{HPT_i^s}},$$

where n is the number of possible fault propagation paths, i is an index value, and $HPT_i^s$ is the shortest static propagation time for the possible fault propagation path i. In certain embodiments, propagation times are computed for one or more gates in the possible fault propagation paths, and the weighted random selection procedure is based at least in part on the computed propagation times. In certain examples, timing information from an SDF file can be used. In certain implementations, a fault activation condition for activating the targeted delay fault is selected using a weighted random selection procedure that favors fault activation conditions having longer arrival times over fault activation conditions having shorter arrival times. In other implementations, a fault activation condition for activating the targeted delay fault is selected using a weighted random selection procedure that favors fault activation conditions having shorter arrival times over fault activation conditions having longer arrival times.

In another embodiment described herein, two or more possible fault activation conditions in an integrated circuit design are identified. The possible fault activation conditions are capable of activating a targeted delay fault at a fault site through a gate in the integrated circuit design. One of the possible fault activation conditions is selected using a weighted random selection procedure. Test pattern values are generated that activate the targeted delay fault at the fault site with the selected fault activation conditions. The test pattern values can be stored. In some implementations, the weighted random path selection procedure favors paths with longer arrival times to the targeted delay fault site over paths with shorter arrival times to the targeted delay fault site. In other implementations, the path selection procedure favors paths with shorter arrival times to the targeted delay fault site over paths with longer arrival times to the targeted delay fault site. In particular implementations, weights are computed for each of the possible fault activation conditions. For example, the computed weight for a respective one of the possible fault activation conditions can indicate the probability that the respective one of the possible fault activation conditions will be selected by the weighted random selection procedure. In a particular example, a weight $w_i$ for a respective possible fault activation condition i is computed as follows:

$$w_i = \frac{AT_i^s}{\sum_{i=1}^{n} AT_i^s},$$

where n is the number of possible fault activation conditions, i is an index value, and $AT_i^s$ is the longest static arrival time to the ith choice to justify the gate. In another particular example, a weight $w_i$ for a respective possible fault activation condition i is computed as follows:

$$w_i = \frac{\frac{1}{HAT_i^s}}{\sum_{i=1}^{n} \frac{1}{HAT_i^s}},$$

where n is the number of possible fault activation conditions, i is an index value, and $HAT_i^s$ is the shortest static arrival time to the ith choice to justify the gate. In certain implementations, activation times for one or more gates in the paths used with the possible fault activation conditions are computed, and the weighted random selection procedure is based at least in part on the computed activation times. The act of computing the activation times can comprise using timing information from an SDF file. In some implementations, a fault propagation path is selected for propagating a fault effect of the targeted delay fault to an observation point of the integrated circuit design using a weighted random selection procedure that favors fault propagation paths having longer propagation times over fault propagation paths having shorter propagation times. In other implementations, a fault propagation path is selected for propagating a fault effect of the targeted delay fault to an observation point of the integrated circuit design using a weighted random selection procedure that favors fault propagation paths having shorter propagation times over fault propagation paths having longer propagation times.

In another embodiment disclosed herein, a fault that is detected by a test pattern is identified by simulating a response of an integrated circuit design to the test pattern in the presence of the fault and identifying one or more paths that are sensitized by the test pattern and that detect the fault. An actual path delay for the identified fault is computed. A determination is made that the identified fault is to be removed from a fault list, the determination being based at least in part on the computed actual path delay. The fault list is modified by removing the identified fault. The modified fault list can be stored. In some implementations, the determination is further based at least in part on the static path delay. For example, in certain implementations, the determination is based at least in part on a relative difference between actual slack and static slack of the longest sensitized path detecting the fault, the actual slack being determined by the actual path delay through the longest sensitized path detecting the fault and the static slack being determined by the static path delay through the longest sensitized path detecting the fault. In certain implementations, the determination is made by determining that the following condition is met:

$$\frac{PD_f^s - PD_f^a}{T_{TC} - PD_f^s} < \delta,$$

where $PD_f^s$ is the static path delay for the fault f, $PD_f^a$ is the actual path delay for the fault, $T_{TC}$ is the test clock period, and $\delta$ is a real number between 0 and 1 and can be user-selectable. In other implementations, the determination is based at least in part on a relative difference between actual slack and static slack of the shortest sensitized path detecting the fault, the actual slack being determined by the actual path delay through the shortest sensitized path detecting the fault and the static slack being determined by the static path delay through the shortest sensitized path detecting the fault. In certain implementations, the determination can include determining that the following condition is met:

$$\frac{HPD_f^a - HPD_f^s}{T_{TC} - HPD_f^s} < \delta,$$

where $HPD_f^s$ is the static path delay through the shortest sensitized path for the fault f, $HPD_f^a$ is the actual path delay through the shortest sensitized path for the fault, $T_{TC}$ is the test clock period, and $\delta$ is a real number between 0 and 1 and can be user-selectable. In particular implementations, the method is repeated for additional faults in the fault list not detected by previously generated test patterns. In some implementations, a good machine simulation is performed to determine a response of the integrated circuit design to the test pattern in the absence of any faults, and one or more paths sensitized by the test pattern are identified.

In another disclosed embodiment, a fault that is detected by a test pattern is identified by simulating a response of an integrated circuit design to the test pattern in the presence of the fault and identifying one or more paths that are sensitized by the test pattern and that detect the fault. A static path delay is computed for a selected sensitized path through the identified fault. A determination is made as to whether a criterion based at least in part on the static path delay is met for the identified fault. The fault list is modified by removing the identified fault if the criterion is met. The modified fault list can be stored. In particular implementations, the selected sensitized path is the longest sensitized path. For example, in certain exemplary implementations, the determination includes determining whether:

$$\frac{T_{TC} - PD_f^s}{T_{TC}} \geq \lambda$$

where $PD_f^s$ is the static path delay through the longest sensitized path for the fault f, $T_{TC}$ is the test clock period, and $\lambda$ is a real number between 0 and 1. In other implementations, the selected sensitized path is the shortest sensitized path. For example, in certain exemplary implementations, the determination includes determining whether:

$$\frac{T_{TC} - HPD_f^s}{T_{TC}} < \lambda$$

where $HPD_f^s$ is the static path delay through the shortest sensitized path for the fault f, $T_{TC}$ is the test clock period, and $\lambda$ is a real number between 0 and 1. In particular implementations, the criterion is a first criterion, and the method further comprises computing an actual path delay for the selected sensitized path through the identified fault, determining whether a second criterion based at least in part on the actual path delay is met for the identified fault, and modifying the fault list by removing the identified fault if the first criterion is not met but the second criterion is met. In one example, the act of determining whether the second criterion is met comprises determining whether:

$$\frac{PD_f^s - PD_f^a}{T_{TC} - PD_f^a} < \delta,$$

where $PD_f^s$ is the static path delay through the longest sensitized path for the fault f, $PD_f^a$ is the actual path delay through the longest sensitized path for the fault, $T_{TC}$ is the test clock period, and $\delta$ is a real number between 0 and 1. In another example, the act of determining whether the second criterion is met comprises determining whether:

$$\frac{HPD_f^a - HPD_f^s}{T_{TC} - HPD_f^s} < \delta,$$

where $HPD_f^s$ is the static path delay through the shortest sensitized path for the fault f, $HPD_f^a$ is the actual path delay through the shortest sensitized path for the fault, $T_{TC}$ is the test clock period, and $\delta$ is a real number between 0 and 1. The method can be repeated for additional faults in the fault list not detected by previously generated test patterns.

In another disclosed embodiment, a response of an integrated circuit design to a test pattern is simulated in the absence of any faults in the integrated circuit design. Paths sensitized by the test pattern are identified by backward tracing from the observation points of the integrated circuit design and analyzing sensitization conditions in the integrated circuit design (including, for example, reconvergent path sensitization conditions). A fault detected by the test pattern is identified by simulating a response of the integrated circuit design to the test pattern in the presence of the fault and determining that one or more of the identified paths detect the fault. A path delay for the one or more paths that detect the fault is determined. The path delay can be stored. In particular implementations, the path delay is computed using the longest propagation time in the identified paths. In other implementations, the path delay is computed suing the shortest propagation time in the identified paths. In certain implementations, the path delay is a current path delay, and the act of storing the path delay comprises comparing the current path delay to a previously stored path delay associated with the fault, and replacing the previously stored path delay with the current path delay if the current path delay is longer. In other implementations, the path delay is a current path delay, and the act of storing the path delay comprises comparing the current path delay to a previously stored path delay associated with the fault, and replacing the previously stored path delay with the current path delay if the current path delay is shorter. In some implementations, the path delay is the actual path delay. In these implementations, an actual slack time using the actual path delay can be computed, and the fault can be removed from a fault list if a user-selected criterion based at least in part on the actual slack time is met. Further, in particular implementations, the act of identifying paths comprises identifying reconvergent sensitization paths.

Any of the disclosed methods can be implemented as computer-readable media comprising computer-executable instructions for causing a computer to perform the methods. Any of the disclosed methods implemented in a computer environment can also be performed by a single computer or via a network. Further, computer-readable media storing test patterns or test pattern values (or any other final or intermediate results) produced by any of the disclosed methods are also disclosed.

The foregoing and other objects, features, and advantages of the invention will become more apparent from the following detailed description, which proceeds with reference to the accompanying figures.

DETAILED DESCRIPTION

General Considerations

Figure 1:
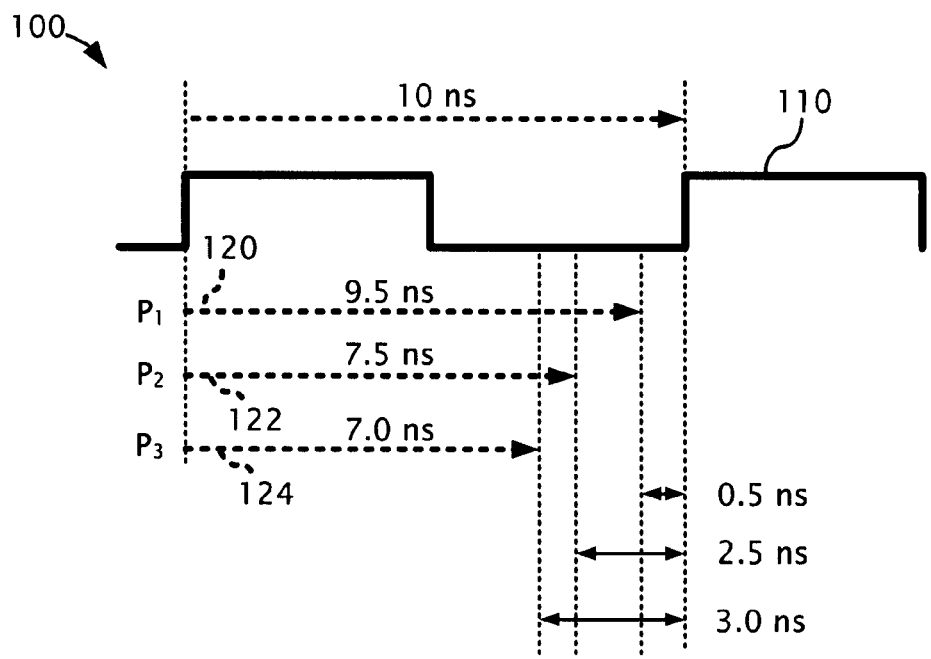
FIG. 1 is a schematic block diagram illustrating how the delay on a path can impact the size of the defect delay that is detectable on the path.

Disclosed herein are exemplary methods, apparatus, and systems for performing timing-aware ATPG, which can be used, for example, to improve the quality of a test set generated for detecting delay defects. The disclosed methods, apparatus, and systems should not be construed as limiting in any way. Instead, the present disclosure is directed toward all novel and nonobvious features and aspects of the various disclosed methods, apparatus, systems, and equivalents thereof, alone and in various combinations and subcombinations with one another. The present disclosure is not limited to any specific aspect or feature, or combination thereof, nor do the disclosed methods, apparatus, and systems require that any one or more specific advantages be present or problems be solved.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "identify" and "determine" to describe the disclosed methods. These terms are high-level abstractions of the actual operations that are performed. The actual operations that correspond to these terms will vary depending on the particular implementation and are readily discernible by one of ordinary skill in the art.

The disclosed embodiments can be used to generate test patterns for testing a wide variety of scan-based or partially-scan-based circuits (for example, application-specific integrated circuits (ASICs) (including mixed-signal ASICs), systems-on-a-chip (SoCs), or programmable logic devices (PLDs), such as field programmable gate arrays (FPGAs)). Any of the methods or techniques described herein can be performed using software that comprises computer-executable instructions for causing a computer to perform the methods or techniques stored on one or more computer-readable media. Such software can comprise, for example, an electronic-design-automation (EDA) software tool, such as an ATPG tool. Any such software can be executed on a single computer or on a networked computer system (for example, via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer and that the disclosed technology can be implemented using any commercially available computer. For the same reason, computer hardware is not described in further detail.

One or more test patterns or intermediate results produced by any of the disclosed methods, apparatus, and systems can also be stored on one or more computer-readable media as part of the described ATPG methods and techniques and are considered to be within the scope of this disclosure. Computer-readable media storing such test patterns or intermediate results may be accessed and used by a single computer, networked computer (such as those described above), or dedicated testing system (for example, a tester or automatic testing equipment (ATE)).

Any of the disclosed methods can be used to generate test patterns in a computer simulation environment wherein test patterns are generated for representations of circuits, which are stored on one or more computer-readable media. For example, the disclosed methods typically use circuit design information (for example, a netlist, HDL description (such as a Verilog or VHDL description), GDSII description, or the like) stored on computer-readable media. For presentation purposes, however, the present disclosure sometimes refers to the circuit and its circuit components by their physical counterpart (for example, gates, primary outputs, paths, and other such terms). It should be understood, however, that any such reference not only includes the physical components but also representations of such circuit components as are used in simulation, ATPG, or other such EDA environments.

As used in this disclosure and the claims, the singular forms "a," "an," and "the" include the plural forms unless the context clearly dictates otherwise. Additionally, the term "includes" means "comprises."

Further, certain aspects of the disclosed technology involve storing or retrieving data from one or more lists. As used herein, the term "list" refers to a collection or arrangement of data that is usable by a computer. A list may be, for example, a data structure or combination of data structures (such as a queue, stack, array, linked list, heap, or tree) that organizes data for better processing efficiency, or any other structured logical or physical representation of data in a computer system or computer-readable media (such as a table used in a relational database). Moreover, any of the lists discussed herein may be persistent (that is, the list may be stored in computer-readable media such that it is available beyond the execution of the application creating and using the list) or non-persistent (that is, the list may be only temporarily stored in computer-readable media such that it is cleared when the application creating and using the list is closed or when the list is no longer needed by the application).

Furthermore, the disclosed embodiments can be used in connection with any suitable delay defect fault model. For example, any known or newly developed delay defect fault model can be used with the disclosed embodiments (e.g., the transition fault model or the as late as possible transition fault (ALAPTF) model described in P. Gupta and M. S. Hsiao, "ALAPTF: A New Transition Fault Model and the ATPG Algorithm," *Proc. ITC* 2004, pp. 1053-1060).

Introduction to Disclosed Technology

Embodiments of the disclosed technology integrate timing information (e.g., I/O path and interconnect delay information from SDF files) into the test generation process. In exemplary embodiments, the transition fault model is adopted, since it is applicable to large industrial designs. It should be understood, however, that other fault models may be used depending on the implementation. Among the various aspects of the disclosed technology that may be realized alone or in various combinations or subcombinations with one another are the following:

Timing information can be applied during the test generation process. In some embodiments, timing information is applied to guide fault propagation. For example, timing information can be used to propagate the fault effect to a primary output (e.g., an output pin) or pseudo primary output (e.g., an input of a scan cell) through a selected sensitization path (e.g., the longest or other desirably long sensitization path). In some embodiments, timing information is applied to guide fault activation. For example, timing information can be used to launch the transition at a fault site from a primary input (e.g., an input pin) or a pseudo-primary input (e.g., an output of a scan cell) through the longest (or other desirably long) path. In certain desirable embodiments, timing information is used to guide both fault propagation and fault activation.

Timing information can also be applied during the fault simulation process. In certain embodiments, for example, timing information is applied to calculate the fault effect propagation time from the transition fault site to an observation point and to calculate the transition arrival time to the transition fault site from primary inputs or pseudo-primary inputs.

Fault dropping criteria can also be used during test generation. For example, in certain embodiments, one or more of the following criteria are used: test generation effort, test pattern count, and/or test quality of the delay defects. In certain desirable embodiments, a criteria based on actual path delay of a sensitized path detecting a fault is used to determine whether a fault is to be dropped. In other desirable embodiments, a criterion based on both static path delay and actual path delay of a sensitized path detecting a fault is used to determine whether a fault is to be dropped.

The resulting test patterns can be evaluated using test quality metrics. For example, test quality can be evaluated by applying both delay test coverage and statistical delay quality level (SDQL) metrics.

Detecting Delay Defects

Depending on the size of a delay defect, the extra delay caused by the defect may not impact all of the paths passing though the delay fault site. For example, shorter paths typically have larger slack margins than longer paths and can tolerate additional delay. Consider, for example, the schematic block diagram 100 shown in FIG. 1. Block diagram 100 shows a clock waveform 110 relative to the path delays 120, 122, 124 of three exemplary paths $P_1, P_2, P_3$ on which a given fault can be detected. Path $P_1$ has the longest path delay of 9.5 ns, path $P_2$ has a path delay of 7.5 ns, and path $P_3$ has a path delay of 7.0 ns. Assume that the clock period of the clock waveform 110 is 10 ns. Consequently, the slacks for the paths $P_1, P_2, P_3$ (the difference between the system clock period and the path delay) are 0.5 ns, 2.5 ns, and 3 ns, respectively. In general, the smallest defect delay that can be detected on a given path is equal to the slack of the path. For example, on path $P_1$, the smallest defect delay that can be detected is 0.5 ns, because 0.5 ns+9.5 ns=10 ns (the clock period). A defect delay greater than 0.5 ns will cause the path $P_1$ to fail, as the delay will be greater than the system clock period. The delay defect will therefore be detected on the path. By contrast, a defect delay of 0.5 ns will not be detected on the paths $P_2$, $P_3$. Accordingly, it is desirable to select longer paths for fault propagation and fault activation during the test pattern generation process.

Exemplary Methods of Performing Delay Calculations

To calculate the delays at each gate in the design accurately, waveform-based simulation can be used to track the signal changes in time. Integrating the waveform simulation into the test generation tool, however, can slow down the test generation process.

In embodiments of the disclosed technology, the waveform is not simulated explicitly. Instead, the transition arrival time and the fault effect propagation time are used to approximate the path delay through a fault site. As used in this discussion, the transition arrival time for a gate terminal z ($AT_z$) refers to the time to launch a transition at z from primary inputs or pseudo primary inputs through combinational logic gates. The fault effect propagation time from z ($PT_z$) refers to the time to propagate the fault effect at z to a primary output or pseudo primary output through combinational logic gates. The path delay through z ($PD_z$) refers to the sum of $AT_z$ and $PT_z$. The slack at z ($S_z$) refers to the difference between the clock period and $PD_z$.

Exemplary formulas that can be used to determine the transition arrival time from gate inputs to its output z are given below. These formulas do not account for the delay introduced by static hazards, but can be modified to do so if desired.

When the transition at z changes from a controlled value to a non-controlled value:

$$AT_z = \MAX_{i \in I_{cn}}(AT_i + d_i), \quad (1)$$

where $I_{cn}$ is the set of gate inputs with the value that transitions from a controlling value to a non-controlling value, and $d_i$ is the gate delay that propagates the transition from the ith gate input to z. Otherwise:

$$AT_z = \MIN_{i \in I_t}(AT_i + d_i), \quad (2)$$

where $I_t$ is the set of gate inputs with the transition that implies the transition at z; and $d_i$ is the gate delay that propagates the transition from the ith gate input to z. In one exemplary embodiment, the values of $AT_i$ and $d_i$ are computed from the timing information stored in an SDF file (e.g., produced by a static timing analysis tool).

Unlike conventional path delay computation techniques, which use either robust or nonrobust conditions to evaluate the propagation time starting from a gate terminal through a path, an exemplary embodiment of the disclosed technology considers sensitization conditions used to propagate faults when determining the propagation time starting from a fault site. This exemplary method allows reconvergent sensitization paths to be taken into account.

Figure 2:
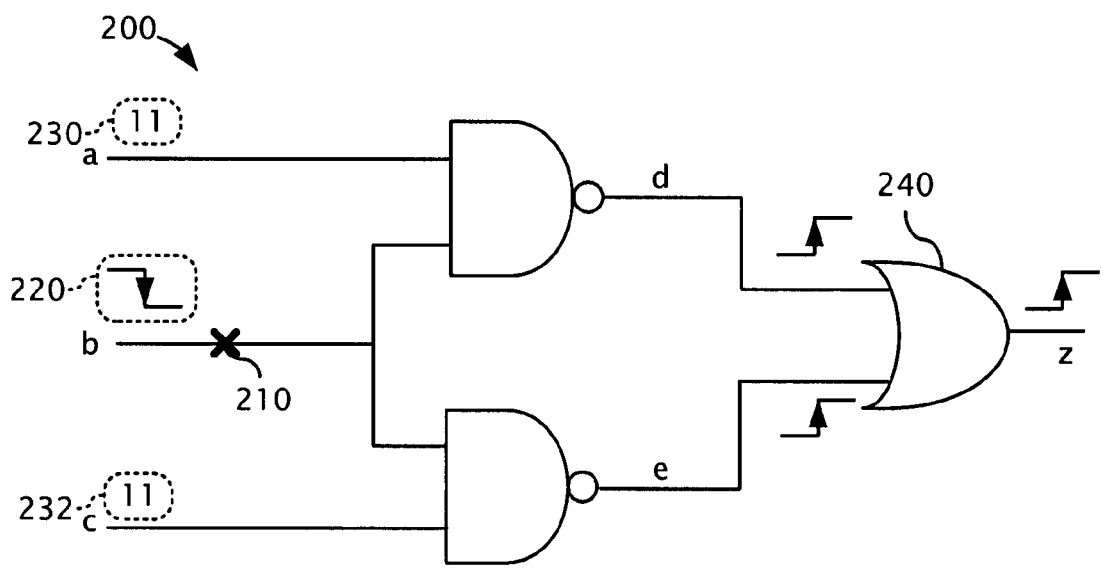
FIG. 2 is a schematic block diagram of a circuit portion illustrating how embodiments of the disclosed technology can identify reconvergent sensitization paths.

FIG. 2 is a schematic block diagram 200 illustrating a transition propagating through two reconvergent sensitization paths. In FIG. 2, a slow-to-fall transition fault 210 is shown on path b. Furthermore, a 1-to-0 transition 220 for activating the fault (illustrated as a falling edge, but representing the test-pattern transition 1-to-0) is shown as being applied to the path b as part of a test pattern. Other test-pattern-value sequences 230, 232 are shown being applied in FIG. 2 but are represented by their actual values (in FIG. 2, the first number in the sequence represents the value applied during a first time frame, whereas the second number represents the value applied during a second time frame).

In FIG. 2, neither a robust test nor a nonrobust test exists to test the path delay fault b-d-z (b-e-z) slow-to-fall. Instead, the transition at z is implied from b through reconvergent sensitization paths b-d-z and b-e-z, which both propagate the transition to a common gate 240. When calculating the propagation time from z to b, and according to one exemplary embodiment, the reconvergent sensitization paths between b and z are enumerated and the propagation time at b is determined as below:

$$PT_b = \MIN_{s \in S_{rs}}(PT_z + D_s), \quad (3)$$

where $S_{rs}$ is the set of reconvergent sensitization paths, including b-d-z and b-e-z; and $D_s$ is the delay of the path s in $S_{rs}$.

The propagation time from the sensitized input i of a gate to its output z can be calculated as follows:

$$PT_i = PT_z + d_i^v, \quad (4)$$

where $d_i$ is the gate delay to propagate the transition v at the input i through the gate and v is a rising (or falling) transition when the final value at i is logic 1 (or 0). When the gate output is a stem, the propagation time at the gate output is typically determined by the maximum propagation time among all of its branches.

Industrial designs sometimes contain combinational loops. When calculating arrival times and propagation times for a design with combinational loops, and according to one exemplary embodiment of the disclosed technology, one or more of the following criteria (alone or in combination with one another) can be used to avoid divergence during the delay calculation: (1) to calculate the arrival time at the gate z, paths (e.g., every path) from primary inputs and/or pseudo primary inputs to z cannot contain the same gate more than once; (2) to calculate the propagation time at the gate z, paths (e.g., every path) from z to primary outputs and/or pseudo primary outputs cannot contain the same gate more than once; and (3) the path delay at the gate in a loop is not equal to the sum of the arrival time and the propagation time; instead, the path delay at the gate in the loop is the delay of the longest path through the gate in which the path does not contain the same gate more than once.

Exemplary Delay Test Quality Metrics

One desirable way to evaluate the quality of a test set in detecting delay defects is to check the percentage of functional paths covered by the test set. However, this method can sometimes be impractical due to the exponential number of paths in the designs. According to certain embodiments of the disclosed technology, the delay defect coverage is derived from evaluating the path delays through detected transition faults. For example, two test quality metrics, Delay Test Coverage (DTC) and SDQM, can be determined from derived path delays. For a transition fault f, both metrics use two types of path delay data through the fault site.

Static path delay ($PD_f^s$) refers to the longest path delay passing through f. Static path delay can be calculated, for example, through structural analysis of the combinational part of the design as an approximation for the longest functional path through f.

Actual path delay ($PD_f^a$) refers to the delay that is associated with a test pattern $t_i$ that detects f. According to one exemplary nonlimiting embodiment, the actual path delay can be defined as:

$$PD_f^a(t_i) = AT_f + \MAX_{p \in P_s}(PT_f^p), \quad (5)$$

where $P_s$ is all of the sensitization paths starting from f. For a test set T, and according to one exemplary nonlimiting embodiment, the actual path delay can be defined as:

$$PD_f^a = \MAX_{t_i \in T_D}(PD_f^a(t_i)), \quad (6)$$

where $T_D$ is the set of test patterns in T that detect f. When $T_D$ is empty, $PD_f^a$ is equal to zero.

The Delay Test Coverage Metric

The delay test coverage (DTC) metric can be used to evaluate the effectiveness of a test set at detecting transition faults through the longest paths. DTC is ordinarily independent of clock frequencies and the process-specific delay defect distribution. According to one exemplary nonlimiting embodiment, the DTC can be defined as follows:

$$W_f = \frac{PD_f^a}{PD_f^s} \quad (7)$$

and $$DTC = \frac{\sum_{f \in F} W_f}{N}, \quad (8)$$

where F is the set of transition faults and N is number of faults in F.

The upper bound of the delay test coverage is the transition fault test coverage. In general, the closer the delay test coverage is to the transition fault test coverage, the better the test set is at detecting transition faults through the longest paths.

The SDQM Metric

Figure 3:
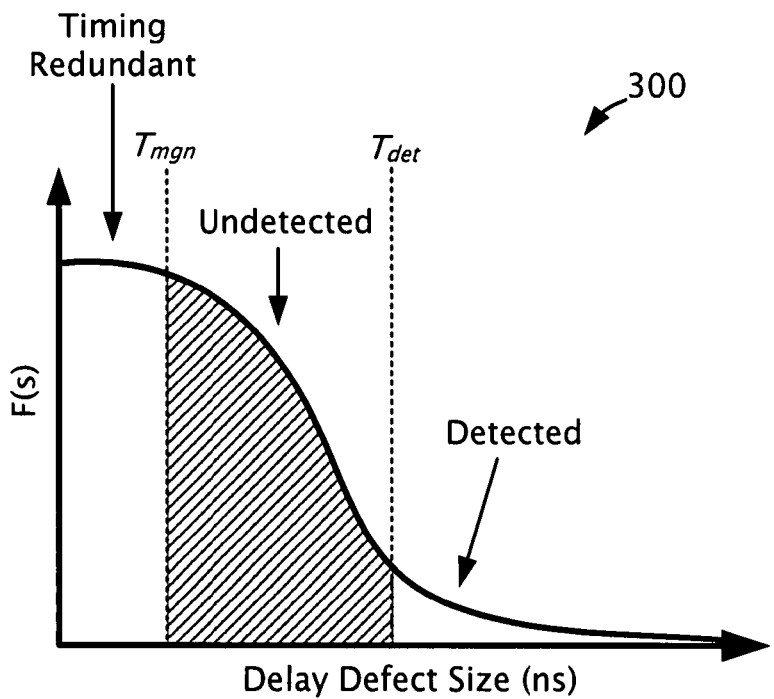
FIG. 3 is a graph illustrating types of delay defects that may not be detectable for a given path delay.

To evaluate the quality of a test set in detecting delay defects, the SDQM typically assumes that the delay defect distribution function F(s) has been derived from the fabrication process, where s is the defect size (incremental delay caused by the defect). Based on the simulation results of a test set, and according to one exemplary nonlimiting embodiment, the smallest detectable delay defect size for a fault f can be calculated as follows:

$$T_f^{det} = \begin{cases} T_{TC} - PD_f^a & \text{if } PD_f^a > 0 \\ \infty & \text{if } PD_f^a = 0 \end{cases}, \quad (9)$$

where $T_{TC}$ is the test clock period. The delay test quality metric, termed the "statistical delay quality level" (SDQL), can be calculated according to one exemplary nonlimiting embodiment by multiplying the distribution probability for each defect as shown below:

$$T_f^{mgn} = T_{SC} - PD_f^s \quad (10)$$

and $$SDQL = \sum_{f \in F} \int_{T_f^{mgn}}^{T_f^{det}} F(s) \, ds, \quad (11)$$

where $T_{SC}$ is the system clock period and F is the fault set. The motivation of the SDQL is to evaluate the test quality based on the delay defect test escapes shown, for example, in the shadowed area in FIG. 3. In general, the smaller the SDQL is, the better the test quality achieved by the test set is since the faults are detected with smaller actual slack.

Additional aspects of the SDQM are described in Y. Sato, S. Hamada, T. Maeda, A. Takatori, and S. Kajihara, "Evaluation of the Statistical Delay Quality Model," *Proc. ASP-DAC* 2005, pp. 305-310, and Y. Sato, S. Hamada, T. Maeda, A. Takatori, and S. Kajihara, "Invisible Delay Quality—SDQM Model Lights Up What Could Not Be Seen," *Proc. ITC* 2005, pp. 1202-1210.

Exemplary Test Generation Embodiments Using Timing Information

To generate test sets that detect the transition faults through the longest paths (or other desirably long paths), exemplary embodiments of the disclosed technology use timing information of the design to guide the transition fault test generation process. In particular embodiments, the timing information is obtained from an SDF file (e.g., generated from a static timing analysis tool) or other equivalent file and used to compute arrival times and propagation times as discussed above. The disclosed test generation procedures that use timing information are generally referred to herein as "timing-aware ATPG."

Figure 4:
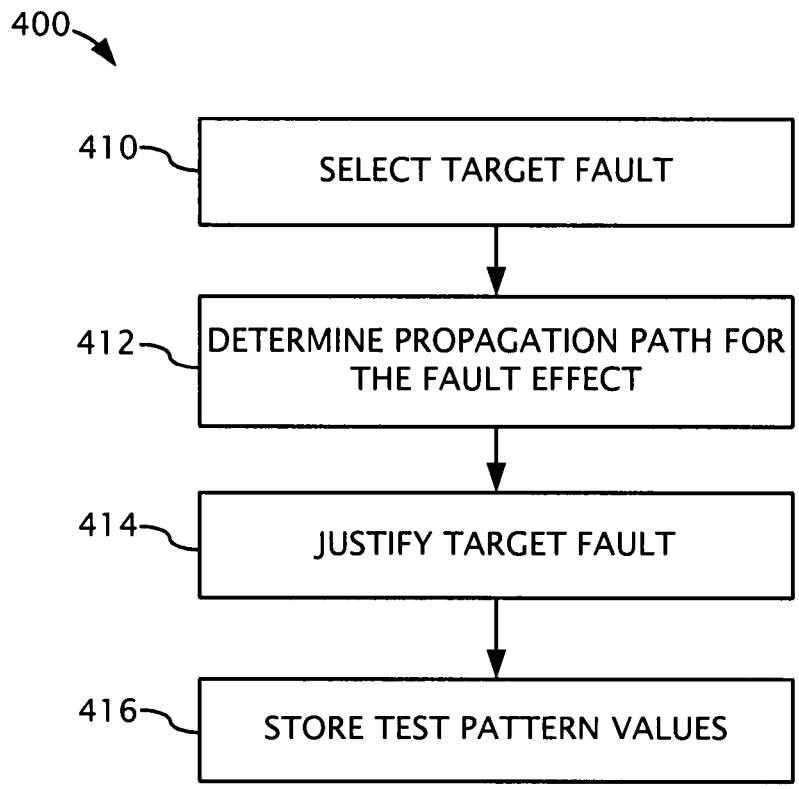
FIG. 4 is a flowchart of an exemplary method of performing timing-aware test pattern generation.

FIG. 4 is a flow chart showing an exemplary test generation method 400 for a targeted transition fault (e.g., a transition fault selected from a list of targeted faults). The method acts shown in FIG. 4 can be performed alone or in various combinations and subcombinations with one another.

At 410, a target fault is selected. For example, the target fault can be selected sequentially from a list of target faults.

At 412, the path for propagating the fault effect is determined. During this method act, for example, the activated transition fault effect is propagated to a primary output or a pseudo primary output through a circuit path. The circuit path can be the longest path, or as explained below, can be selected through a weighted random selection method that favors the longest path, but allows other paths to be selected. In certain implementations, if the state element driven by the pseudo primary output is not an observation point, the fault effect is further propagated through the state element until an observation point is reached. In some implementations, the delay of the propagation path during this second phase is disregarded.

At 414, the target fault is justified. During this method act, for example, one or more unjustified gates used for fault activation are justified. Furthermore, any unjustified gates used for fault propagation are justified. When the unjustified gates are used to control the activation conditions at the fault site, they can be justified using choices that achieve a desirable transition arrival time at the fault site. For example, according to one embodiment, the fault can be justified using choices that maximize the transition arrival time at the fault site. In other desirable embodiments, and as more fully explained below, the justification choices can be made according to a weighted random selection procedure.

At 416, the resulting test pattern portion that detects the target fault by activating the fault through the selected activation path and propagating the fault from the fault site on the selected propagation path is stored. For example, the test pattern portion (sometimes referred to as a test cube) can be stored on one or more computer-readable media (e.g., any suitable persistent or non-persistent computer-readable memory). It should be understood that although the method 400 is described as being performed for a single target fault, multiple target faults can be considered simultaneously. Any description herein or in the claims of performing the described methods for a single fault should therefore be construed to include such embodiments.

To help guide fault effect propagation and gate justification, a pre-processing procedure that generates timing information can be performed. For example, the static propagation times and the static arrival times can be computed before test generation. For example, in one particular embodiment, the longest static propagation times and the longest static arrival times are computed for one or more gates in the design (e.g., for each gate in the design). In particular embodiments, the longest static propagation times and longest static arrival times are computed from the delay information generated by a static timing analyzer and stored in an SDF file.

As noted above, when propagating the fault effect at a stem gate further, the branch with the longest static propagation delay can be preferred in order to maximize the fault propagation time. Similarly, when justifying the gates controlling the fault activation conditions, the choice with longest static arrival time can be preferred to help maximize the transition arrival time to the fault site.

Accurately identifying the unjustified gate necessary to launch the transition at the fault site can also increase the test generation complexity. To reduce this complexity, and according to one exemplary embodiment, if an unjustified gate is in the combinational cone dominated by the fault site, its value can be treated as a necessary value to create the transition at the fault site.

Although using the longest static propagation time at the stem usually creates the longest sensitization path, it may potentially propagate fault effects through the same fault propagation paths repeatedly while targeting different faults. Besides testing the faults through the longest paths, covering a wide range of paths is another desirable component of timing-aware test generation. Testing a wide range of paths can be desirable, for instance, because timing information is not always accurate and may not exactly reflect the actual delays experienced along a circuit path. For example, in some cases, paths with the longest delay as computed with information from an SDF file may not in fact be the path with the longest delay.

To achieve the testing of a wider range of paths, a weighted random method can be used in certain embodiments of the disclosed technology to select the branches for fault propagation. For example, assuming that the fault effect is going to be propagated from a stem with n branches, the probability of selecting the branch i for fault propagation can be determined as follows:

$$w_i = \frac{PT_i^s}{\sum_{i=1}^{n} PT_i^s}, \quad (12)$$

where $PT_i^s$ is the longest static propagation time from the branch i. The weighted random method assigns higher probabilities of being selected to the paths with longer delays, but does not ignore the paths with shorter delays.

Similar to the fault propagation, the weighted random method can also be used to select the choices to justify the gates controlling the launch conditions at the fault site. The probability of selecting a justification choice is given below:

$$w_i = \frac{AT_i^s}{\sum_{i=1}^{n} AT_i^s}, \quad (13)$$

where $AT_i^s$ is the longest static arrival time to the ith choice to justify the gate and n is number of choices to justify the gate.

Figure 5:
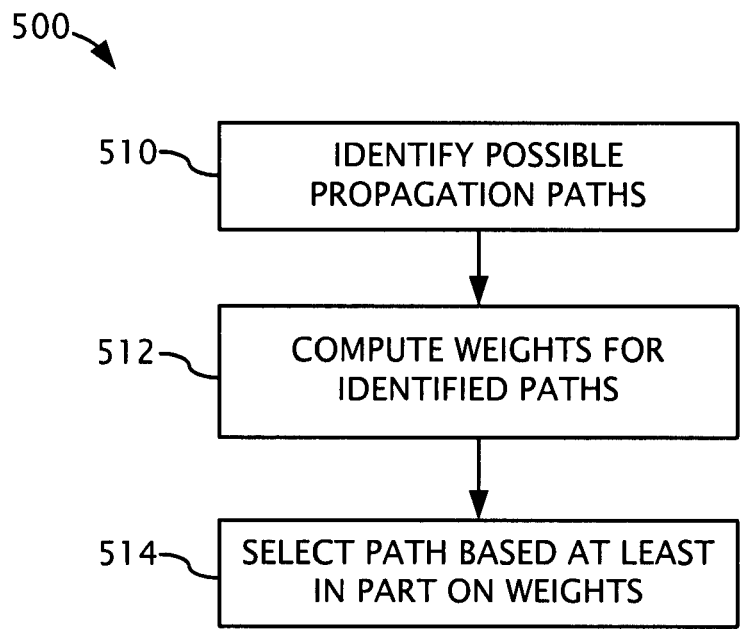
FIG. 5 is a flowchart of an exemplary method for determining propagation paths as can be used in the timing-aware test pattern generation method of FIG. 4.

FIG. 5 is a flowchart 500 of a method for selecting a propagation path using a weighted random method. The method acts shown in FIG. 5 can be performed alone or in various combinations and subcombinations with one another. At 510, the possible propagation paths are identified. At 512, weights for each of the identified paths can be computed using timing information. For instance, as in expression (12), the longest static propagation time for each of the identified paths can be used at least in part in the weighting computation. At 514, one of the identified paths is randomly selected using a procedure whereby the probability of selecting a respective path is proportional to or otherwise based on the computed weight for the path.

Figure 6:
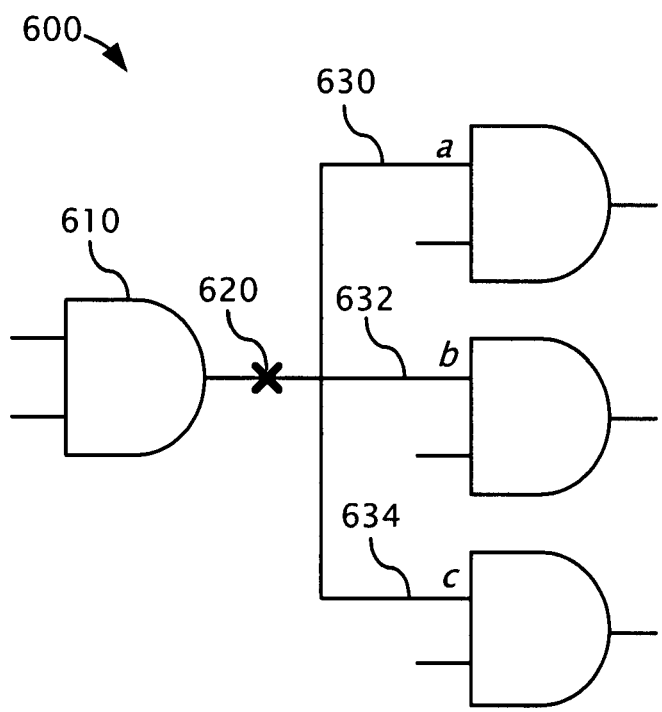
FIG. 6 is a schematic block diagram illustrating the propagation path selection method of FIG. 5.

FIG. 6 is a schematic block diagram showing an exemplary circuit portion 600 illustrating how fault propagation can proceed according to a random weighted procedure, such as by using expression (12). FIG. 6 shows a gate 610 having a fault site 620 at its output where the target fault effect occurs (here, a slow-to-rise transition fault potentially caused, for example, by some circuit defect). The fault effect can potentially be propagated along branches 630 (branch a), 632 (branch b), 634 (branch c) to a primary output or pseudo-primary output (not shown). Assume in this example that a timing analysis (e.g., a static timing analysis performed in a pre-processing step) determines that the longest static propagation times along the paths ($PT_x$) are as follows:

$PT_a$=10 ns $PT_b$=6 ns $PT_c$=2 ns

Applying expression (12), the following weights can be determined for each choice:

$$w_a = \frac{10}{10+6+2} = 0.56$$

$$w_b = \frac{6}{10+6+2} = 0.33$$

$$w_c = \frac{2}{10+6+2} = 0.11$$

One of the branches 630, 632, 634 can then be randomly selected with its probability of selection being determined by the computed weights.

Figure 7:
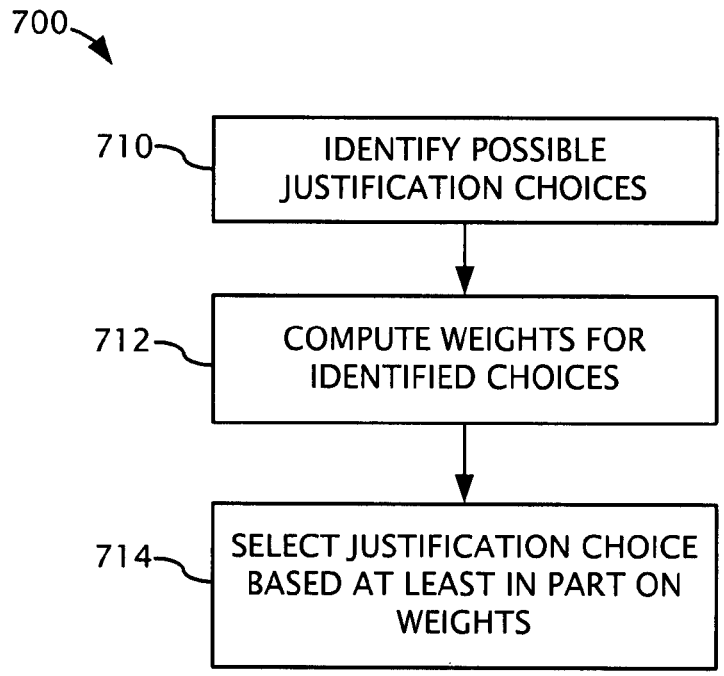
FIG. 7 is a flowchart of an exemplary method for determining fault activation conditions as can be used in the timing-aware test pattern generation method of FIG. 4.

FIG. 7 is a flowchart 700 of a method for selecting activation conditions for activating the target fault using a weighted random method. At 710, the possible justification choices (or fault activation conditions) for the target fault are identified. For example, possible paths for propagating controlling values that activate the targeted fault are identified. At 712, weights for each of the identified justification choices can be computed using timing information. For instance, as in expression (13), the longest static arrival time for each choice can be used at least in part in the weighting computation. At 714, one of the identified choices is randomly selected using a procedure whereby the probability of selecting a respective choice is proportional to or otherwise based on the computed weight for the choice.

Figure 8:
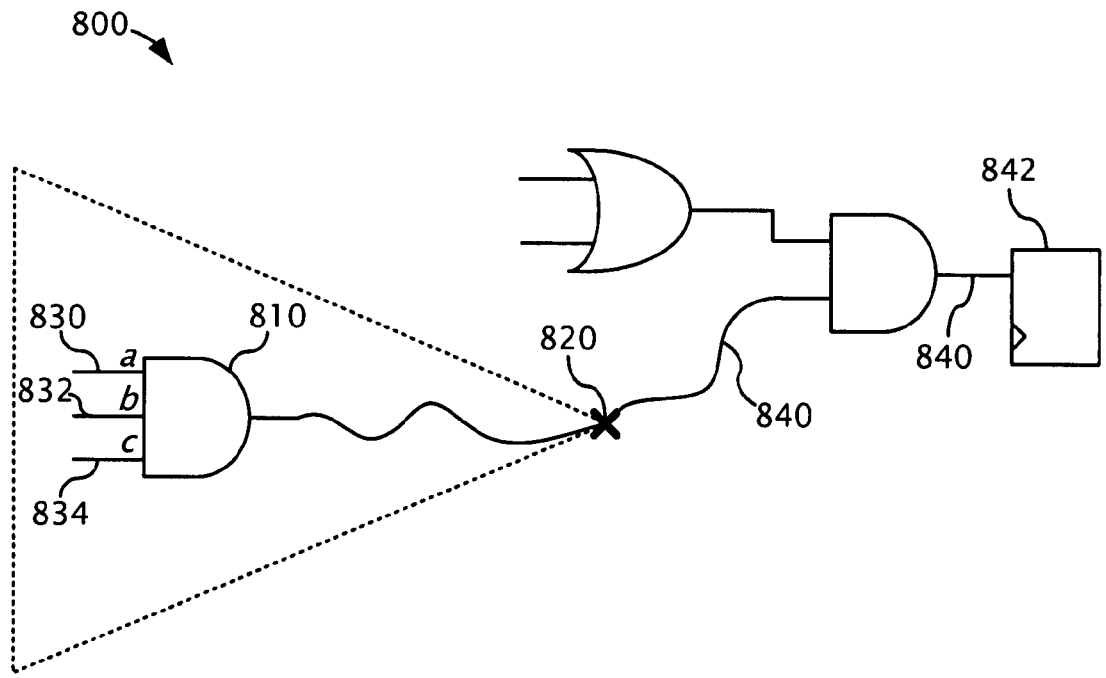
FIG. 8 is a schematic block diagram illustrating the fault activation condition selection method of FIG. 7.

FIG. 8 is a schematic block diagram showing an exemplary circuit portion 800 illustrating how fault activation can proceed according to a random weighted procedure, such as by using expression (13). FIG. 8 shows a first gate 810 with three inputs 830 (input a), 832 (input b), and 834 (input c). FIG. 8 further shows a fault site 820 at the output of the gate 810 where the target fault is desirably activated and an exemplary propagation path 840 to a primary output 842 (here, a scan cell). The fault can potentially be activated at the output of the first gate 810 by justifying controlling values to one of the inputs 830, 832, 834 of the first gate 810. Assume in this example that a timing analysis (e.g., a static timing analysis performed in a pre-processing step) determines that the longest static arrival times ($AT_x$) of values at each of the inputs a, b, and c are as follows:

$AT_a = 8$ ns $AT_b = 3$ ns $AT_c = 2$ ns

Applying expression (13), the following weights can be determined for each choice:

$$w_a = \frac{8}{8+3+2} = 0.62$$

$$w_b = \frac{3}{8+3+2} = 0.23$$

$$w_c = \frac{2}{8+3+2} = 0.15$$

One of the inputs 830, 832, 834 can then be randomly selected with its probability of selection being determined by the computed weights.

Fault Simulation

To derive the delay test quality of a test set, the fault simulation process is desirably enhanced to utilize the actual path delays for each detected fault. For example, a transition-based method and/or a path-based method can be used to calculate the actual path delays.

In certain exemplary embodiments of the disclosed technology that use a transition-based method, a detected fault f is not dropped from the fault list during fault simulation unless the difference between the static path delay and the actual path delay of f is not greater than the difference between test clock period and system clock period. Since the evaluation of static path delay is typically not accurate and is generally greater than the delay of the longest functionally sensitizable path, this method can result in high computational complexity. However, these embodiments can provide an exact way to identify the sensitization paths to propagate the fault effects.

Path-based methods can generally be viewed as non-fault-oriented methods. According to certain exemplary embodiments of the disclosed technology that use path-based methods, actual path delays are derived from good machine simulations of test patterns (e.g., of each test pattern in a test set). In comparison to transition-based methods, embodiments of the path-based method typically have smaller fault simulation times.

In particular implementations using a path-based method, non-robust conditions or robust conditions are used as sensitization conditions to trace the circuit backward (e.g., from each observation point), in order to identify the faults detected at the observation points. However, such path-based methods typically cannot identify all of the detected transition faults since faults detected through reconvergent sensitization paths generally cannot be found with non-robust conditions. Thus, in particularly desirably embodiments, relaxed path tracing conditions (instead of robust or nonrobust conditions) are used to guide the backward tracing. In general, a sensitization condition also exists when there are multiple controlling transitions at the inputs of a gate on possible fault propagation paths. A controlling transition is a transition that stabilizes at the controlling value of a gate input (e.g., a 1 to 0 transition for AND and NAND gates and a 0 to 1 transition for OR and NOR gates). In FIG. 2, for example, the rising transitions on paths d and e at the inputs of the OR gate 240 are both controlling transitions as they stabilize to 1. Furthermore, if the multiple controlling transitions at the gate can be traced to a common source (a reconvergent source) that is affected by the targeted fault, then the fault is detectable on the fault propagation path. Thus, by considering sensitization conditions, reconvergent sensitization paths can be identified during the backward tracing procedure and detected transition faults that would not be identified when requiring robust or nonrobust condition can be identified. Unless otherwise stated, the path-based method using sensitization conditions and described above was used in the experiments described below for calculating the actual path delays.

Figure 9:
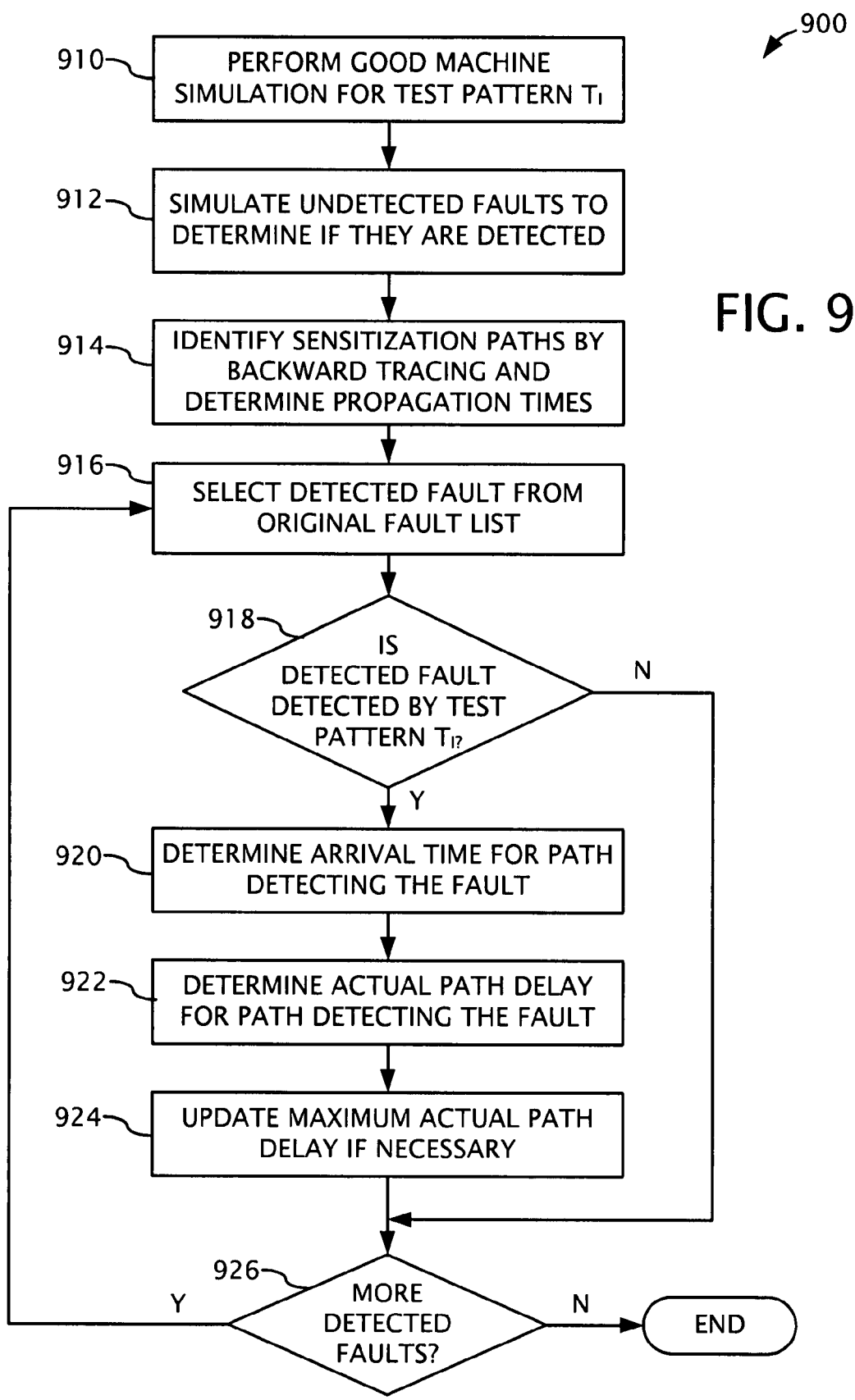
FIG. 9 is a flowchart of an exemplary method for performing timing-aware fault simulation.

FIG. 9 is a flowchart showing an exemplary method 900 for performing fault simulation. The method acts shown in FIG. 9 can be performed alone or in various combinations and subcombinations with one another. Furthermore, the particular sequence shown should not be construed as limiting (e.g., method acts 912 and 914 can be performed in a different order).

At 910, good machine simulation is performed for test pattern $t_i$. For example, a simulation (e.g., a logic simulation) of the integrated circuit design can be performed to determine how the gates of the circuit design respond to the test values of the test pattern $t_i$.

At 912, fault simulation is performed for undetected faults of a target fault list. For example, the circuit design's response to the test pattern $t_i$ in the presence of the undetected faults can be simulated. In particular embodiments, each undetected fault from the fault list is fault simulated. In certain embodiments, if the undetected faults that are simulated are detected by the test pattern $t_i$, they are removed from the fault list. However, in embodiments discussed in more detail below, one or more fault dropping criteria are used to determine whether the fault is to be removed from the fault list. When fault dropping criteria are used, the determination of whether to remove the fault from the fault list may not occur until the necessary timing information is determined (e.g., until after method act 922 has been performed for a selected fault).

At 914, backward tracing is performed from one or more observation points of the integrated circuit design to identify sensitization paths. In particular embodiments, backward tracing is performed using the good machine simulation results and from each observation point (e.g., each primary output and pseudo primary output). Furthermore, in certain embodiments, the maximum propagation times are determined for one or more gates in the sensitization paths (e.g., for each gate in the sensitization path).

At 916, a detected fault f from the original fault list is selected. The detected fault selected can be a fault detected by an earlier test pattern and/or one of the faults determined at 912 to be detected by the test pattern $t_i$.

At 918, a determination is made as to whether the selected fault f is in one of the identified sensitization paths and whether the activation condition for f is met. If the selected fault f is in one of the identified sensitization paths and if its activation condition is met, the method 900 continues at 920; otherwise, the method proceeds to 926 where a determination is made as to whether there are any additional detected faults to consider, and if so the next detected fault f from the original list is selected at 916.

At 920, the arrival time to the fault f is determined. For example, the maximum arrival time to the fault f is determined.

At 922, the actual path delay passing through f is determined. For example, the actual path delay is determined by combining the maximum propagation time determined at 914 and the maximum arrival time determined at 920.

At 924, the maximum actual path delay through f is updated if the current actual delay is larger. That is, in certain embodiments, each fault has associated with it a maximum actual path delay that is stored with the fault. The actual path delay can be used for example to derive the test quality or to help guide the fault dropping process. If the current actual delay computed at 924 is larger than the previously stored maximum actual path delay, the path delay is updated.

At 926, a determination is made as to whether any additional detected faults remain to be considered. If so, then the method 900 return to 916 and the next detected fault is selected; otherwise, the method 900 ends.

Although arrival times are shown as being determined on a per-fault basis in the above method acts, they can be determined simultaneously with one or more other faults. For example, the arrival times for all faults can be determined simultaneously.

Figure 10:
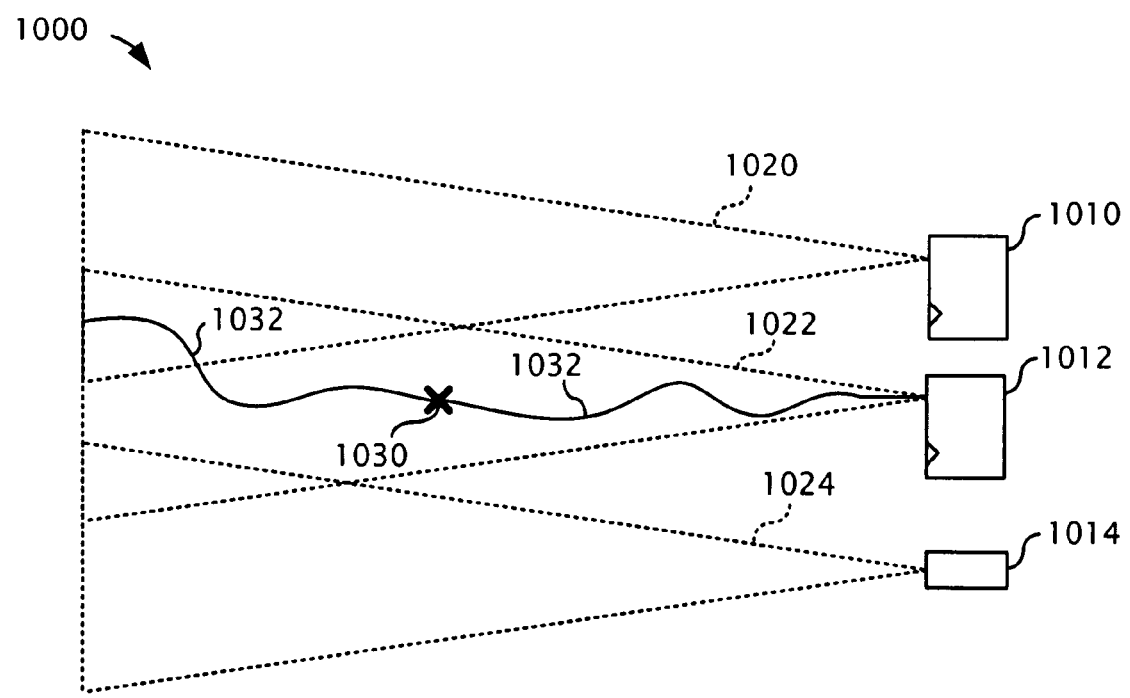
FIG. 10 is a schematic block diagram illustrating the exemplary fault simulation method of FIG. 9.

FIG. 10 is a schematic block diagram of an exemplary circuit portion 1000 illustrating aspects of the method 900. For example, circuit portion 1000 has three observation points 1010, 1012, 1014. In the example shown in FIG. 10, observation points 1010, 1012 are scan cell inputs (and thus comprise pseudo primary outputs), whereas the observation point 1014 is an output pin (and thus comprises a primary output). Sensitized paths 1020, 1022, 1024 from each of the observation points 1010, 1012, 1014 are also illustrated. The sensitization paths 1020, 1022, 1024 are illustrated schematically as logic cones, though it should be understand that they represent the paths whose value at the respective primary output is controllable by changing the value at a single input (e.g., a scan cell or input pin). As noted above with respect to FIG. 9, the sensitization paths are determined using good simulation results for a particular test pattern $t_i$ at 914. FIG. 10 also illustrates an exemplary fault 1030 selected from the fault list. In this example, fault 1030 is in one of the sensitized paths 1022. Therefore, according to the method 900, the actual path delay for the fault is determined by computing the maximal arrival time for the sensitized path that activates and propagates the fault 1030 to the pseudo primary output 1012 (illustrated as path 1032). If the actual path delay computed is greater than the previously stored actual path delay, then the actual path delay for the fault is updated by storing the new actual path delay.

Fault Dropping Criteria

After a test pattern or a subset of test patterns is generated, conventional test generators fault simulate all of the undetected faults in order to find the faults detected by chance and remove them from the target fault list. This strategy can help reduce the test generation time. However, using detection as the only criterion to drop a fault does not mean that the delay faults will be detected through the longest (or other desirably long) paths since the path detecting the fault may not be the longest sensitizable path (or other desirably long path) through that fault site. In general, the longest sensitizable paths (or other desirably long paths) to detect a delay defect are unknown in advance, and the structure-based static path analysis only provides an upper bound for the longest delays passing through gates.

In certain embodiments, a deterministic test generator can be used to identify the longest sensitizable paths through fault sites such that a detected fault cannot be dropped from the fault list unless it is targeted by the deterministic test generator explicitly or the actual delay through the fault site is equal to the longest static delay. However, using this fault dropping criterion can increase the test generation effort and may be impractical to apply on large industrial designs.

In certain other embodiments, multiple detection can be used as an additional fault dropping condition in order to improve the possibility of detecting faults through the longest (or other desirably long) paths. However, the experimental results given below show that the increase of detection times has limited improvement on the delay test coverage.

In certain desirable embodiments of the disclosed technology, a fault dropping criterion based at least in part on the actual path delay is used. For example, a criterion, named "Dropping Based on Slack Margin" (DSM) can be used. DSM allows a tradeoff among the test generation effort, test pattern count, and the test set quality for delay detects.

According to one exemplary embodiment of the DSM technique, a fault f is dropped from the target fault list if a test pattern $t_i$ detects f and the actual path delay created by $t_i$ satisfies the following condition:

$$\frac{PD_f^s - PD_f^a}{T_{TC} - PD_f^a} < \delta \qquad (14)$$

where $T_{TC}$ is test clock period and $\delta$ is a real number between 0 and 1 and may be selected by the user. Expression (14) means that a fault is dropped when the relative difference between the actual slack and the static slack of a path (the slack margin) is less than some predefined limit. Other criteria based at least in part on the actual path delay can also be used. (Note that the mathematical operation in expression (14) and the other expressions in this disclosure may vary from implementation to implementation (e.g., the operations may be $\leq$, $>$, $\geq$) depending, for example, on whether the criterion is used to determine whether a fault should be dropped or used to determine whether a fault should be left remaining on the list.)

The criterion DSM with $1=\delta$ is equivalent to the traditional fault dropping criterion. Further, when $0=\delta$, every fault will be targeted by the deterministic test generator. In general, as smaller values of $\delta$ are chosen for test generation, the test pattern counts increase.

Figure 11:
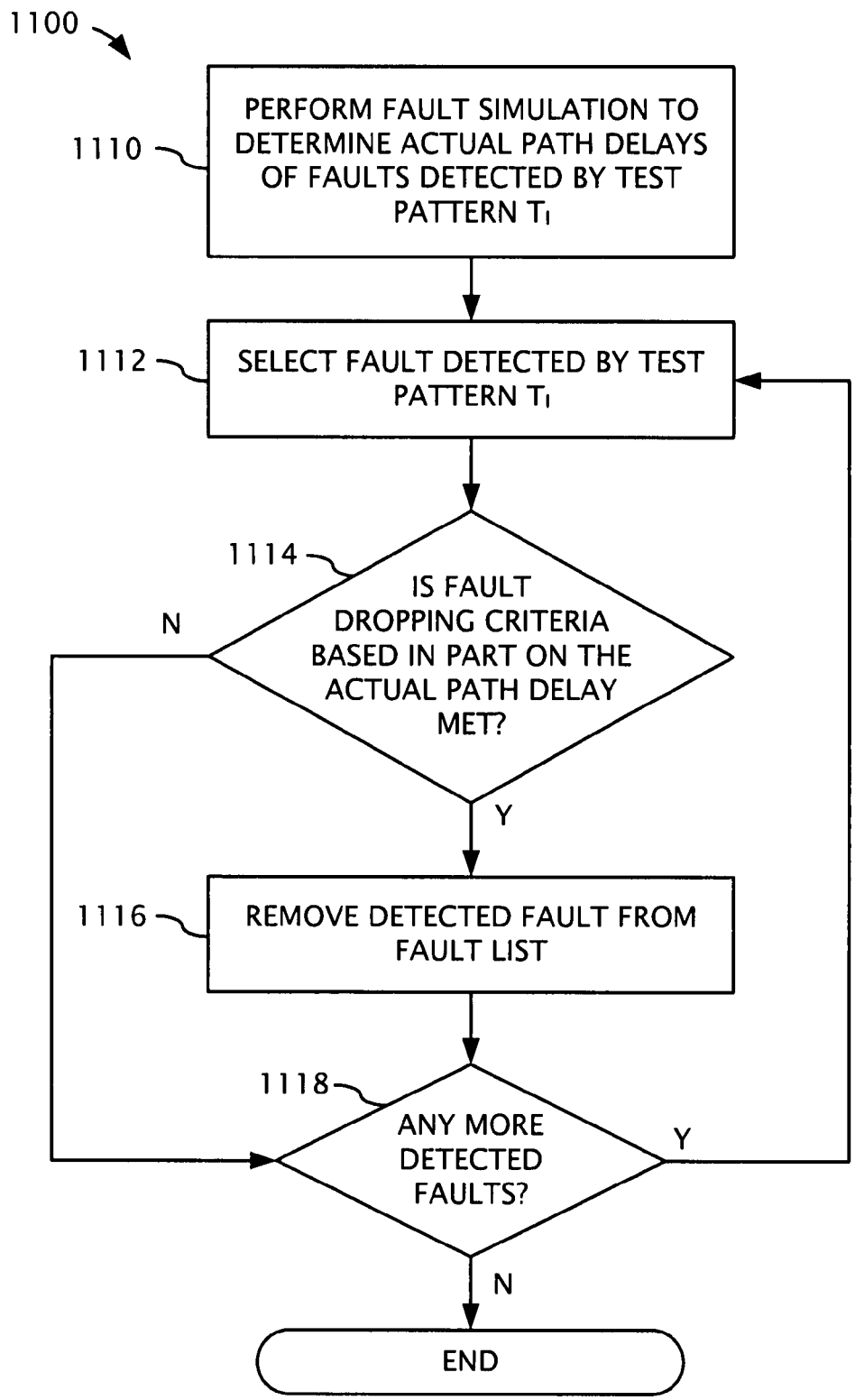
FIG. 11 is a flowchart of an exemplary timing-aware fault dropping method as can be used in any of the disclosed embodiments.

FIG. 11 is a flowchart of an exemplary embodiment 1100 for applying the fault dropping criterion. At 1110, fault simulation is performed for a test pattern to determine the actual path delays. For example, the fault simulation procedure 900 illustrated in FIG. 9 can be performed for a test pattern $t_i$. At

1112, a fault detected by the test pattern $t_i$ is selected. For example, one of the faults that was determined to be detected by the test pattern $t_i$ (e.g., at 912) can be selected. At 1114, a determination is made as to whether the fault should be removed from the fault list based at least in part on the actual slack of the path. For example, a criteria based on the slack margin (such as the criteria in expression (14)) can be used. Based on the outcome of the determination at 1114, the fault is either removed at 1116 or left remaining on the fault list. At 1118, a determination is made as to whether any faults remain on the fault list that were detected by the test pattern $t_i$. If so, the method returns to 1112 and the next fault is selected; otherwise, the method 1100 terminates.

Although the method 1100 is shown as being separate from the fault simulation method 900 in FIG. 11, portions of the procedure can be integrated into the fault simulation procedure. For example, method acts 1114, 1116 can be performed during the fault simulation method 900 (e.g., after the actual path delay for each detected fault is determined).

Test Quality Evaluation for Industrial Designs

Two industrial designs were used to evaluate the test set quality generated by embodiments of the timing-aware ATPG technique. The characteristics of the designs are shown in Table 1. The nominal delays defined in SDF files were used to calculate the path delays. To calculate SDQL, the delay defect distribution was calculated according to the delay defect distribution function F(s) described in Y. Sato, S. Hamada, T. Maeda, A. Takatori, and S. Kajihara, "Invisible Delay Quality—SDQM Model Lights Up What Could Not Be Seen," Proc. ITC 2005, pp. 1202-1210:

$$F(s) = 1.58 \times 10^{-3} \times e^{2.1s} + 4.94 \times 10^{-6}, \quad (15)$$

TABLE 1

Characteristics of the Designs

| | \|G\| | \|FF\| | \|CLK\| | SDQL | \|SDF\| |
|---|---|---|---|---|---|
| Case-1 | 240K | 14.6K | 2 | 241.6 | 854K |
| Case-2 | 2.43M | 69.1K | 4 | 783 | 4.4M |

In Table 1, |G| is the number of gates in the design, |FF| is the number of sequential elements, |CLK| is the number of clocks, SDQL is the SDQL level in parts per million (ppm) before applying any test patterns, and |SDF| is the number of delay statements defined in SDF file.

For each design, three types of experiments were performed to generate three groups of broadside transition fault test sets. In the first experiments (Exp. 1), traditional ATPG was performed. During the experiments, a random decision order was used when launching and propagating the fault effect. A fault was dropped from the fault list once it was detected by the fault simulator N times. In the second experiments (Exp. 2), timing-aware ATPG was performed without using the DSM fault-dropping criteria. In particular, integrated timing information from SDF was used to guide the test generation. The weighted random method described above and using expressions (12) and (13) was used during test generation. A fault was dropped from the fault list once it was detected by the fault simulator N times. In the third experiments (Exp. 3), timing-aware ATPG with the DSM fault-dropping criteria shown in expression (14) was performed. The setup was the same as Exp. 2, but multiple detection was not used. Instead, detected faults were dropped based on the DSM criterion introduced above to improve the test set quality.

The test generation results for the two designs are shown in Table 2 and Table 3, respectively. For the first two experiments, the number of detections was run up to 20 for both designs. When applying the DSM criterion in the third experiment, δ was set to 1, 0.5, 0.25, and 0. For each ATPG run, four numbers are reported in the tables to show the test generation results: number of generated test patterns denoted as |P|, test coverage denoted as TC, delay test coverage denoted as DTC, and SDQL in parts per million (ppm).

TABLE 2

Test generation results for Case-1

| | \|P\| | TC | DTC | SDQL |
|---|---|---|---|---|
| Initial | 0 | 0 | 0 | 241.6 |
| Exp. 1 - Traditional ATPG | | | | |
| N = 1 | 5,217 | 90.99% | 84.59% | 36.34 |
| N = 3 | 6,352 | 91.12% | 85.04% | 35.37 |
| N = 5 | 6,730 | 91.15% | 85.10% | 35.18 |
| N = 7 | 7,093 | 91.19% | 85.18% | 35.00 |
| N = 15 | 8,184 | 91.23% | 85.24% | 34.38 |
| N = 20 | 8,932 | 91.24% | 85.25% | 34.18 |
| Exp. 2 - Timing-Aware ATPG | | | | |
| N = 1 | 5,233 | 90.86% | 84.64% | 36.45 |
| N = 3 | 6,438 | 91.03% | 85.10% | 35.41 |
| N = 5 | 6,743 | 91.09% | 85.21% | 35.12 |
| N = 7 | 7,120 | 91.13% | 85.30% | 34.85 |
| N = 15 | 8,277 | 91.20% | 85.39% | 34.61 |
| N = 20 | 8,937 | 91.22% | 85.41% | 34.57 |
| Exp. 3 - Timing-Aware ATPG with DSM Criteria | | | | |
| δ = 1 | 5,233 | 90.86% | 84.64% | 36.45 |
| δ = 0.5 | 9,851 | 90.95% | 85.70% | 34.16 |
| δ = 0.25 | 18,695 | 91.06% | 86.62% | 32.16 |
| δ = 0 | 64,369 | 91.16% | 87.81% | 29.28 |

TABLE 3

Test generation results for Case-2

| | \|P\| | TC | DTC | SDQL |
|---|---|---|---|---|
| Initial | 0 | 0 | 0 | 783 |
| Exp. 1 - Traditional ATPG | | | | |
| N = 1 | 3,668 | 91.23% | 66.13% | 214.8 |
| N = 3 | 5,829 | 91.27% | 67.26% | 208.9 |
| N = 5 | 6,955 | 91.27% | 67.73% | 206.4 |
| N = 7 | 7,979 | 91.27% | 68.07% | 204.6 |
| N = 15 | 12,254 | 91.28% | 69.01% | 199.5 |
| N = 20 | 14,932 | 91.28% | 69.41% | 197.4 |
| Exp. 2 - Timing-Aware ATPG | | | | |
| N = 1 | 3,508 | 91.19% | 67.39% | 208.9 |
| N = 3 | 5,430 | 91.24% | 68.37% | 203.6 |
| N = 5 | 6,615 | 91.26% | 68.79% | 201.4 |
| N = 7 | 7,624 | 91.26% | 69.13% | 198.6 |
| N = 15 | 12,013 | 91.27% | 70.25% | 193.5 |
| N = 20 | 14,526 | 91.28% | 70.73% | 190.9 |
| Exp. 3 - Timing-Aware ATPG with DSM Criteria | | | | |
| δ = 1 | 3,508 | 91.19% | 67.39% | 208.9 |
| δ = 0.5 | 8,642 | 91.26% | 76.26% | 160.5 |
| δ = 0.25 | 13,937 | 91.27% | 77.09% | 156.2 |
| δ = 0 | 24,493 | 91.28% | 77.71% | 152.9 |

When comparing Exp. 1 with Exp. 2 for the same value of N, it can be seen that timing-aware ATPG achieved better test quality in terms of delay test coverage, and a similar number of test patterns were generated. The delay test coverage improvement was more significant for the design Case-2. For example, the delay test coverage increased by 1.26% when N=1 and by 1.32% when N=20. After analyzing the limited improvement in the delay test coverage with the timing-aware ATPG for the design Case-1, it can be observed that most paths in the design have similar delays and the test generation guided by timing information has less impact on the overall test quality for the delay faults. This observation can also be seen from the difference between the delay test coverage and the test coverage. When N=1, the difference was only 6.4% for the design Case-1. However, it was 25.1% for the design Case-2. Although the delay test coverage improvement with the timing-aware ATPG was limited for Case-2, the timing-aware ATPG generated fewer test patterns while achieving the same level of delay test coverage. For example, 7,120 test patterns were generated with the timing-aware ATPG when N=7 and it achieved 85.30% delay test coverage. However, the traditional ATPG required more than 8,932 test patterns to achieve a similar level of delay test coverage. When measuring the test quality by SDQL, both the traditional ATPG and the timing-aware ATPG achieved a similar level of SDQL for design Case-1 due to the similar delays for most of paths in the design. However, a significant improvement was achieved for design Case-2. For example, the SDQL was reduced from 214.8 to 208.9 when N=1.

The effectiveness of using SDM as a fault dropping criterion can be observed for both designs. From Table 2 and Table 3, it can be seen that significant delay test coverage and SDQL improvements were achieved as δ decreased. When comparing δ=0.5 with Exp. 2 with largest N, the delay test coverage increased from 85.41% to 85.70% for the design Case-1, and from 69.13% to 76.26% for the design Case-2. The SDQL was reduced from 34.57 to 34.16 for the design Case-1, and from 198.6 to 160.5 for the design Case-2. The test pattern count increased by 88.25% and 135.6% when comparing δ=0.5 with the traditional ATPG with N=1. However, for the design Case-2, 42.12% less of test patterns are generated when comparing with the traditional ATPG with N=20.

From Table 3, it can also be seen that multiple detection alone had limited effectiveness on improving the test quality for delay defects. The ATPG results also illustrate that multiple detection may not be suitable for achieving higher test quality for small delay defects when the path length in the design is unbalanced. Embodiments of the timing-aware ATPG method, however, can be used to improve the test quality, particularly for such types of designs.

Figure 12:
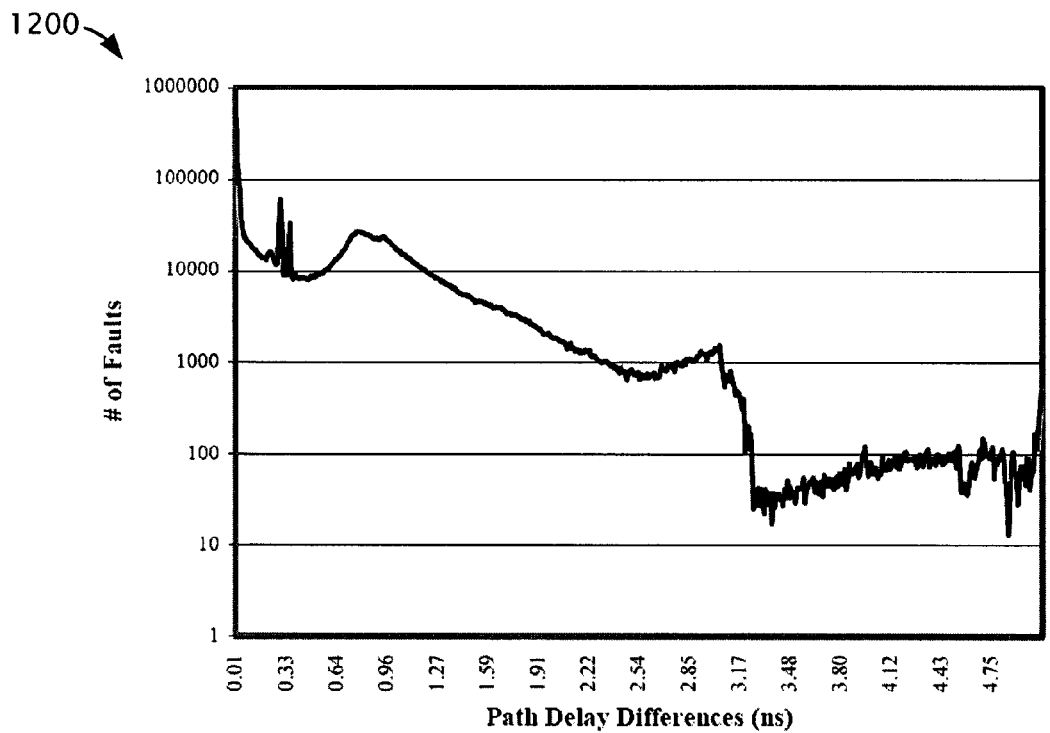
FIG. 12 is a first graph reporting experimental results. The graph in FIG. 12 shows the distribution of differences between static and actual path delays for traditional ATPG.
Figure 13:
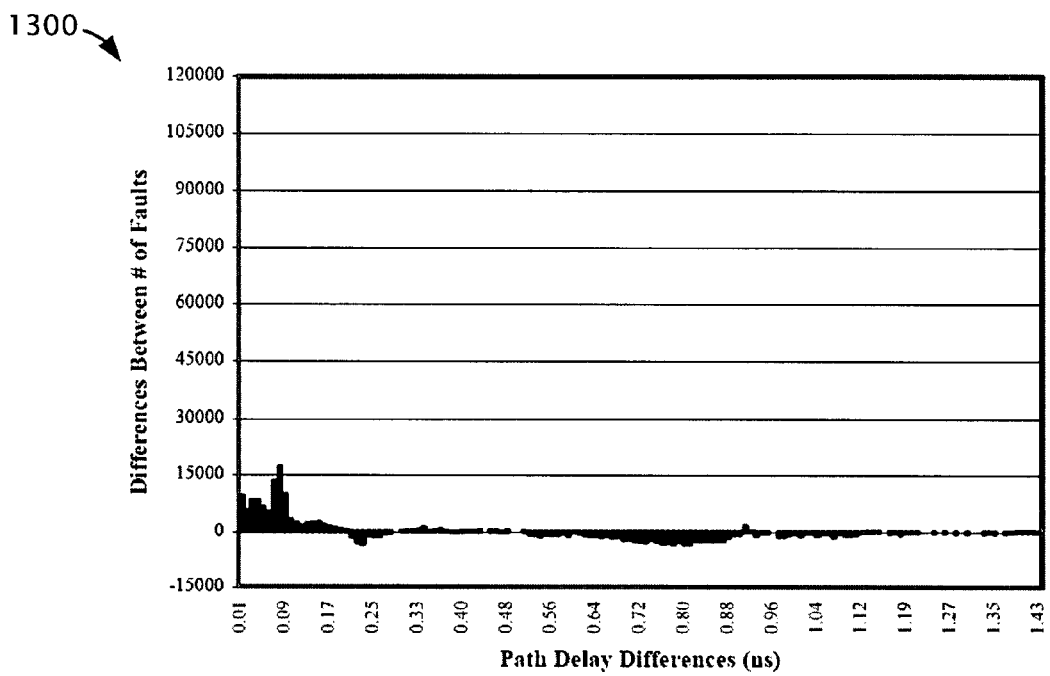
FIG. 13 is a second graph reporting experimental results. The graph in FIG. 13 shows results from a conventional ATPG method and an exemplary embodiment of timing-aware ATPG with N=1.
Figure 14:
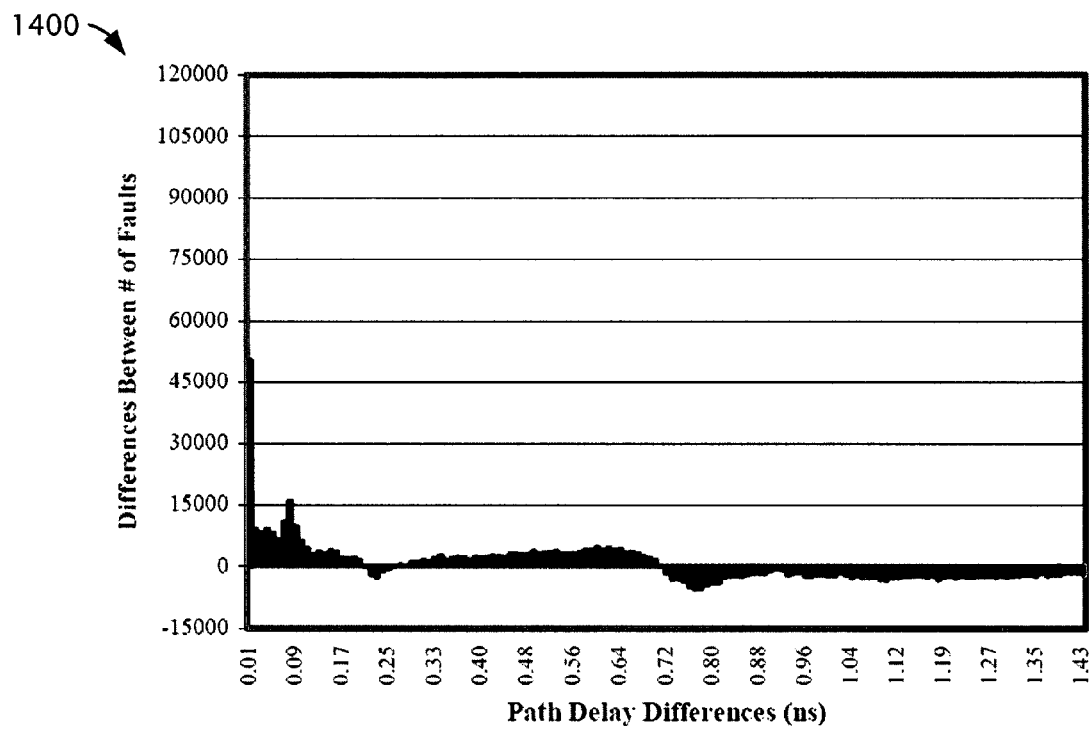
FIG. 14 is a third graph reporting experimental results. The graph in FIG. 14 shows results from a conventional ATPG method and an exemplary embodiment of timing-aware ATPG with N=20.
Figure 15:
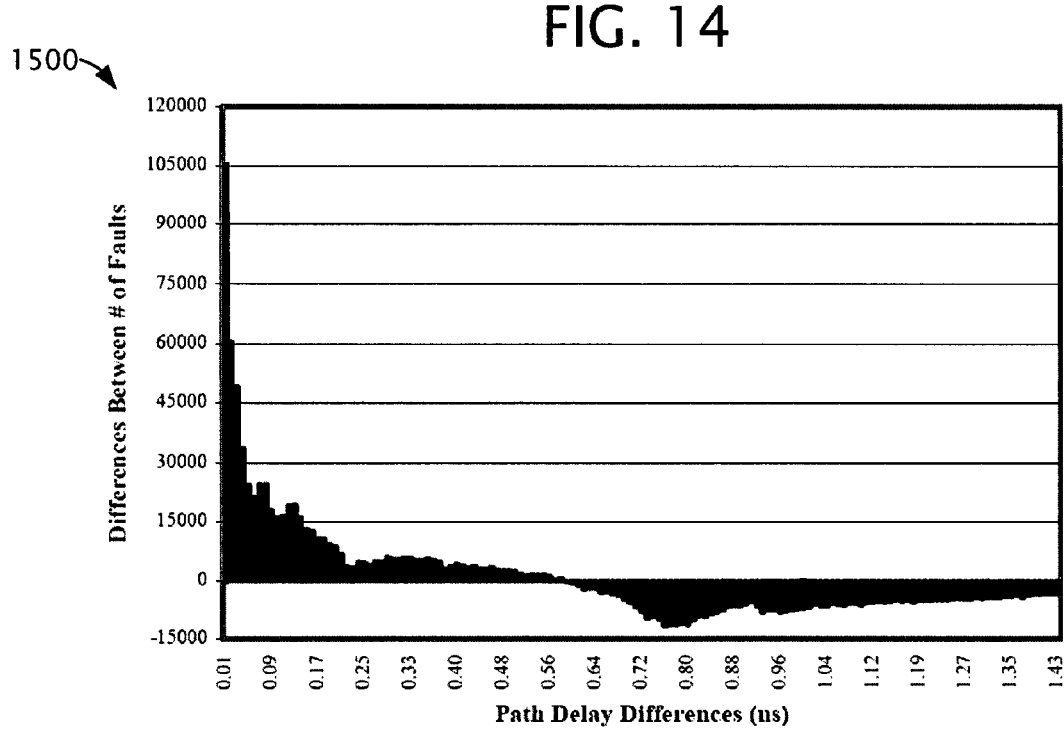
FIG. 15 is a fourth graph reporting experimental results. The graph in FIG. 15 shows results from a conventional ATPG method and an exemplary embodiment of timing-aware ATPG with DSM=0.5.

To illustrate the effectiveness of the timing-aware ATPG at detecting delay faults through longer paths further, FIG. 12 is a graph 1200 showing the distribution of the differences between the maximal static path delay and the maximal actual path delay through each detected transition fault by the traditional ATPG with N=1 for the design Case-2. It can be seen that 50% of detected faults have path delay differences less than 0.54 ns. When the path delay difference reaches 1.43 ns, 90% of detected faults are covered. Rather than showing the distribution of the static and actual path delay differences for the test sets generated by timing-aware ATPG directly, graphs 1300, 1400, 1500 of FIGS. 13, 14, and 15 show the distribution differences between the traditional ATPG with N=1 and the timing-aware ATPG with N=1, N=20, and DSM=0.5, respectively. As seen, more detected faults move to the region with fewer differences. For the timing-aware ATPG with N=1, N=20, and DSM=0, the percentages of covered detected faults become 52.8%, 56.8%, and 69.5% at 0.54 ns and become 90.3%, 93.1%, and 94.6% at 1.43 ns. These results demonstrate that embodiments of the timing-aware ATPG method can improve the test set quality and the test sets ability to detect small delay defects.

It should be noted that in the reported experiments, the test coverage achieved by the timing-aware ATPG was slightly lower than that achieved by the traditional ATPG. The main reason is that the exemplary embodiments of the timing-aware ATPG method that were tested attempted to propagate the fault effects and to justify the gates through the longest paths. This likely caused more faults to be aborted during test generation when both ATPG methods had the same backtrack limit. Increasing the backtrack limit when performing embodiments of the ATPG method can help reduce the gap between test coverage differences. Another way to reduce the test coverage gap is to try the aborted fault a second time with traditional ATPG.

Timing Critical Faults

When a delay defect is present in a circuit, the defect's impact on the normal operation of the circuit depends on the defect's location and delay fault size. If the delay fault size is greater than the slack of the shortest functional path, $S_{min}$, the circuit will malfunction independent of the delay defect's location in the functional paths. Test patterns generated based on the traditional transition fault model can ordinarily detect this type of delay defect during at-speed testing. If the delay fault size is less than the slack of the longest functional path, $S_{max}$, the circuit will operate correctly even if the delay defects are presented in the functional paths. When the delay fault size is between $S_{min}$ and $S_{max}$, the circuit will malfunction during normal operation if the sum of the longest path delay passing through the defect and extra delay introduced by the defect is greater than the system clock period; otherwise, the circuit will still operate correctly.

In certain embodiments, a timing-aware deterministic test generator is used to test transition faults (e.g., every transition fault) through the longest sensitizable path. Furthermore, in certain implementations, a fault is not dropped from the fault list unless it is targeted by the deterministic test generator explicitly or unless a slack margin (DSM) criterion is met. In some cases, however, this methodology produces an undesirably high test pattern count.

To address this issue, certain desirable embodiments of the disclosed technology target a subset of transition faults explicitly by using a timing-aware deterministic test generation procedure (e.g., any of the above-described test pattern generation procedures that use timing information) whereas the remainder of the transition faults are targeted by a deterministic test generation procedure that does not take timing information into consideration. This procedure allows a tradeoff among the test generation effort, test pattern count, and test set quality for delay defect. This procedure also takes into account the fact that small delay defects have a higher probability of being introduced during fabrication than large delay defects. Functional paths with tight slack margins are more vulnerable to violate timing constraints in the presence of the small delay defects.

According to one exemplary embodiment, a fault f is classified as a so-called "timing critical fault" that is desirably targeted by a timing-aware deterministic test generation procedure if the static path delay associated with f satisfies the following condition:

$$\frac{T_{TC} - PD_f^s}{T_{TC}} < \lambda, \qquad (16)$$

where $T_{TC}$ is the test clock period and λ is a real number between 0 and 1 and may be selected by the user. Expression (16) means that a fault is in a timing critical functional path when the minimum slack margin is less than some predefined limit. Other criteria based at least in part on the static path delay can also be used.

In the described example, when the critical fault identification criterion is 1 ($\lambda=1$), all transition faults are classified as timing critical faults. In general, as smaller values of $\lambda$ are chosen for test generation, fewer transition faults are classified as timing critical faults and thus the test pattern counts generated by the timing-aware deterministic test generation procedure decrease.

Figure 16:
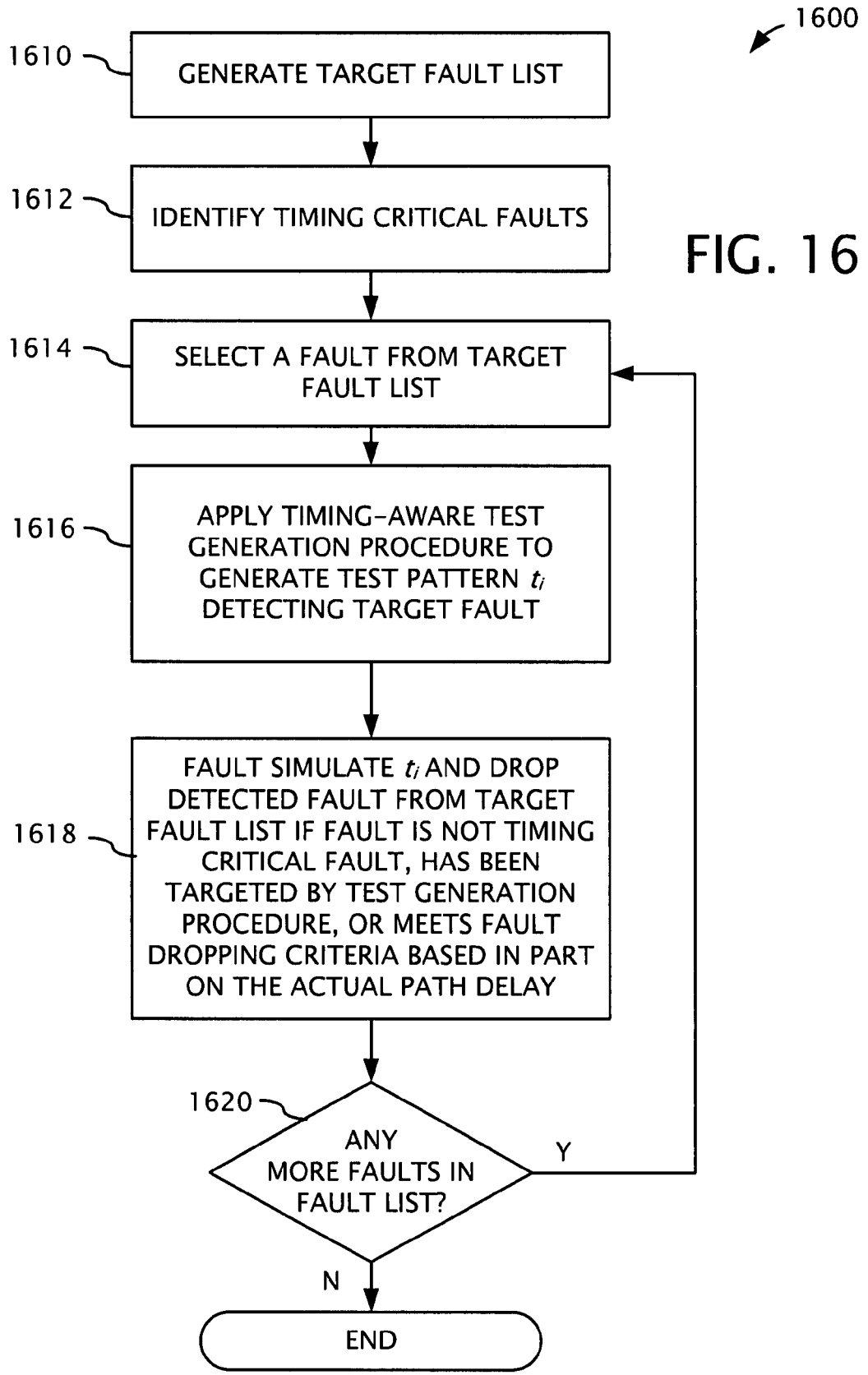
FIG. 16 is a graph showing distributions of example timing critical transition faults with different $\lambda$ for four industrial designs.

FIG. 16 is a flowchart of an exemplary embodiment 1600 for performing test pattern generation using the existence of timing critical faults as an additional criterion. At 1610, the target fault list is generated. At 1612, timing critical faults are identified from the target fault list. For example, in one desirable embodiment, timing critical faults are identified using the criterion shown in expression (16). At 1614, a fault from the target fault list is selected (e.g., the next fault) and is targeted at 1616 by the timing-aware deterministic test generation procedure. For instance, the test generation procedure 400 illustrated in FIG. 4 can be performed to generate a test pattern $t_i$ detecting the target fault. To simplify the test generation process and improve the chance of detecting the non-timing-critical faults, the timing-aware deterministic test generation procedure can be used for all explicitly target faults in this exemplary embodiment. At 1618, fault simulation is carried out to identify the faults detected by $t_i$. In the illustrated embodiment, if a non-timing-critical fault is detected, it is dropped from the target fault list. If a timing-critical-fault is detected, it is dropped from the target fault list if it has been targeted explicitly by the deterministic test generation procedure or if it meets the fault dropping criterion based on actual delay (e.g., the DSM fault dropping criterion described above). At 1620, a determination is made as to whether there are any more faults in the target fault list. If so, the method returns to 1614 and the next target fault is selected from the target fault list; otherwise, the method 1600 terminates.

In other exemplary embodiments, the target fault list only includes timing critical faults and the non-timing critical faults are ignored during timing-aware deterministic test pattern generation. This strategy allows additional tradeoff among the test generation effort, test pattern count, and the test set quality for delay defects.

Test Generation Results for Timing Critical Faults

Figure 17:
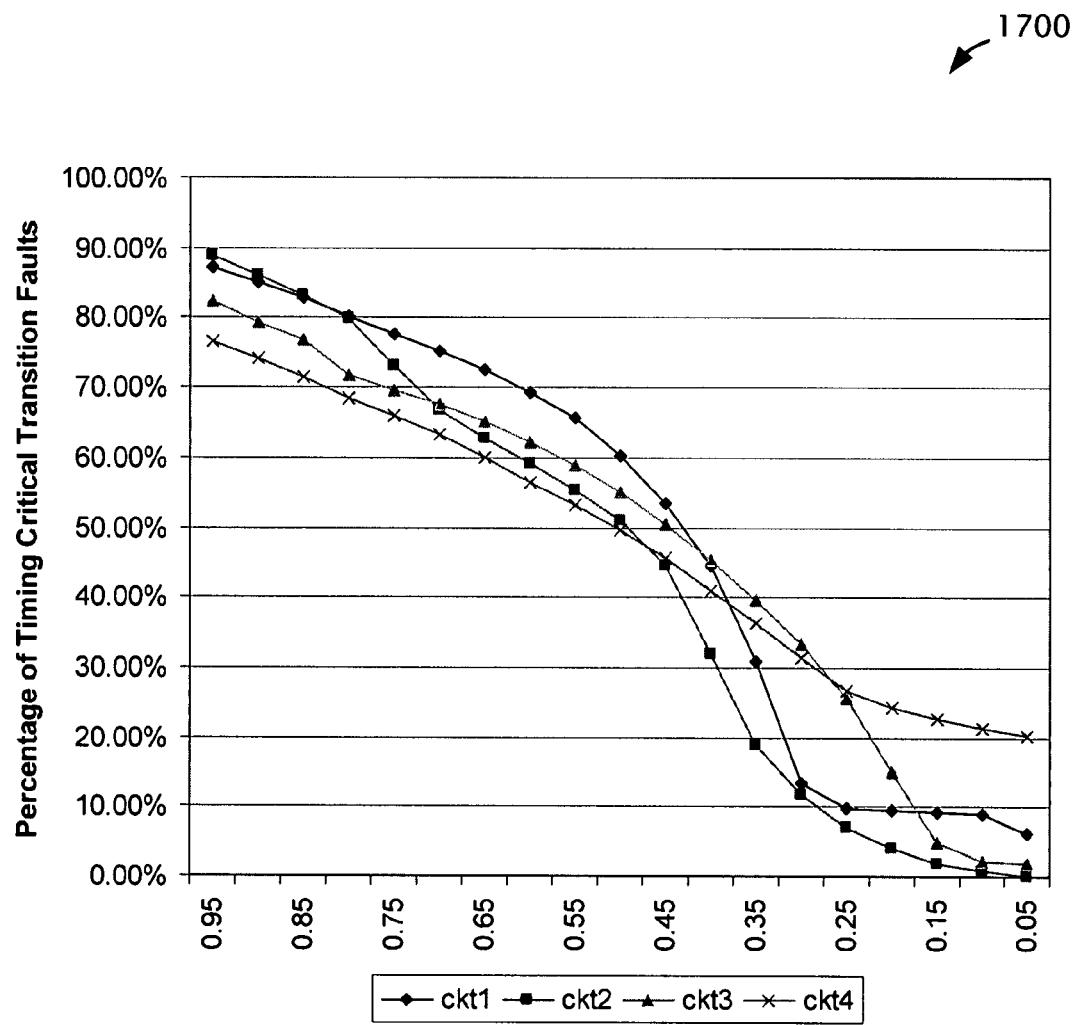
FIG. 17 is a flowchart of an exemplary timing-aware deterministic test generation procedure that includes multiple fault dropping criteria.

Four industrial designs were used to evaluate test generation results from the test pattern generation method described above that uses timing critical faults as an additional criterion. FIG. 17 is a graph 1700 showing the distributions of the timing critical faults for four industry designs. It can be seen that the number of timing critical transition faults decreases as $\lambda$ decreases. For the same $\lambda$, the number of timing critical transition faults is circuit dependent. When $\lambda=0.25$, fewer than 10% of transition faults are timing critical in ckt1 and ckt2, but more than 25% of transition faults are timing critical in ckt3 and ckt4.

For each design shown in FIG. 17, three types of experiments were performed to generate broadside transition fault test sets. In the first experiment (Exp. 1), traditional ATPG was performed. In particular, a fault was dropped from the fault list once it was detected by the fault simulator. In the second experiment (Exp. 2), timing-aware ATPG with the DSM fault-dropping criterion shown in expression (14) was performed and $\delta$ was set to 0.5. In the third experiments (Exp. 3), timing-aware ATPG for the timing critical faults identified based on the criterion shown in expression (16) was performed and $\lambda$ was set to 0.25, 0.2, 0.15, and 0.1, respectively. Meanwhile, the DSM criterion with $\delta=0.5$ was used as an additional fault dropping criterion for the timing critical faults. For all the experiments, the delay test coverage (DTC) shown in expression (8) was used to measure the delay test quality.

The test generation results for the four industrial designs are shown in Table 4. After the design name, the transition fault test coverage is indicated in the column "TC." The test generation results for Exp. 1 and Exp. 2 are shown under the columns "Trad." and "DSM $\delta=0.5$", respectively. Under the columns "$\lambda=0.25$," "$\lambda=0.2$," "$\lambda=0.15$," and "$\lambda=0.1$," the test generation results for Exp. 3 are shown. The test pattern count and delay test coverage for each experiment are shown under the sub-columns "Pat." and "DTC," respectively. It can be seen that the timing-aware ATPG with DSM $\delta=0.5$ generated 46.85% to 139.57% more test patterns than the traditional transition fault ATPG. However, the delay test coverage was improved by 1.8% to 7.46%. By using timing-aware ATPG to target timing critical faults only, the number of generated test patterns was reduced compared to when the DSM alone was used ($\delta=0.5$). In ckt2 and ckt3, the test pattern count with $\lambda=0.1$ is close to the test pattern count from using traditional ATPG. Although the delay test coverage dropped by 0.87% and 2.12% when comparing with DSM $\delta=0.5$. 1.41% and 5.34% delay test coverage improvements are achieved when comparing the results with traditional transition fault ATPG. In ckt1 and ckt4, the test pattern count reduction is not sensitive to $\lambda$ since the percentage of timing critical transition faults does not reduce much as $\lambda$ decreases. However, the test pattern count with $\lambda=0.1$ is still 8.9% less than the test pattern count with DSM $\delta=0.5$ alone and the delay test coverage decreases by only 0.07% and 0.19%, respectively. The experimental results shown in Table 4 demonstrate that targeting the timing critical transition faults by the timing-aware ATPG helps to reduce the test pattern count while having a moderate impact on the overall delay test coverage.

TABLE 4

Test generation results for timing critical faults

| | | Trad. | | DSM $\delta$ = 0.5 | | $\lambda$ = 0.25 | | $\lambda$ = 0.2 | | $\lambda$ = 0.15 | | $\lambda$ = 0.1 | |
| --- | --- | --- | --- | --- | --- | --- | --- | --- | --- | --- | --- | --- | --- |
| Ckt | TC | Pat. | DTC | Pat. | DTC | Pat. | DTC | Pat. | DTC | Pat. | DTC | Pat. | DTC |
| ckt1 | 94.66 | 2847 | 88.02 | 4181 | 89.82 | 3966 | 89.72 | 3918 | 89.71 | 3849 | 89.74 | 3809 | 89.75 |
| ckt2 | 89.96 | 19424 | 72.72 | 30858 | 75.00 | 27479 | 74.61 | 26067 | 74.52 | 23021 | 74.62 | 21282 | 74.13 |
| ckt3 | 90.05 | 3882 | 67.99 | 6073 | 75.45 | 5719 | 75.04 | 5484 | 74.62 | 4885 | 73.66 | 3932 | 73.33 |
| ckt4 | 91.38 | 33048 | 78.36 | 79172 | 81.23 | 75838 | 81.17 | 73986 | 81.08 | 74846 | 81.10 | 72125 | 81.04 |

Detecting Holding Time Violations

Another class of defects that can be addressed using embodiments of the disclosed technology are defects that cause holding time violations (or hold time violations). In general, if the data hold time at a state element's data input violates the design specification, a circuit may malfunction.

To detect hold-time-related defects, the timing-aware ATPG procedure is desirably modified so that instead of creating sensitization paths with longer delays, the ATPG procedure creates sensitization paths with shorter delays (e.g., the shortest delay). Exemplary modifications to the above-described timing-aware ATPG techniques that can be performed to accomplish this objective are described in the sections below.

Exemplary Methods of Performing Delay Calculations for Holding Time Violations

For hold time violations, the calculation for the arrival time at a gate is the same as expressions (1) and (2). To distinguish from expressions (1) and (2), the variables denoting the arrival time are changed from $AT_z$ and $AT_i$ to $HAT_z$ and $HAT_i$, respectively. Thus, expressions (1) and (2) can be rewritten as follows:

$$HAT_z = \MAX_{i \in I_{CN}}(HAT_i + d_i), \tag{17}$$

$$HAT_z = \MIN_{i \in I_t}(HAT_i + d_i), \tag{18}$$

The calculation for the propagation time through reconvergent sensitization paths is the same as expressions (3). To distinguish from expression (3), the variables denoting the propagation time in expression (3) are changed from $PT_b$ and $PT_z$ to $HPT_b$ and $HPT_z$, respectively, for holding time violations. Thus, the expression can be rewritten as follows:

$$HPT_b = \MIN_{s \in S_{rs}}(HPT_z + d_s), \tag{19}$$

The calculation for the propagation time from the sensitized input i of a gate to its output z is the same as expression (4). To distinguish from expression (4), the variables denoting the propagation time in expression (4) are changed from $PT_i$ and $PT_z$ to $HPT_i$ and $HPT_z$, respectively, for holding time violations. Thus, the expression can be rewritten as follows:

$$HPT_i = HPT_z + d_i^v, \tag{20}$$

In certain embodiments, for holding time violations, the definition of the static path delay is changed from referring to the longest path delay passing through f to the shortest path delay passing through f. The static path delay can be calculated, for example, through structural analysis of the combinational part of the design as an approximation of the shortest functional path through f. To distinguish from the longest static path delay $PD_f^s$, the shortest static path delay is denoted as $HPD_f^s$.

Similarly, for holding time violations, the definition for actual path delay is changed from referring to the longest sensitization path detecting f to the shortest sensitization path detecting f. To distinguish from the longest path delay $PD_f^a$, the actual path delay is denoted as $HPD_f^a$. The calculation for the shortest actual path delay that detects the defects is changed accordingly. For one exemplary embodiment, the shortest actual path delay associated with a test pattern $t_i$ that detects f is defined as:

$$HPD_f^a(t_i) = AT_f + \MIN_{p \in P_s}(HPT_f^p), \tag{21}$$

where $P_s$ is all of the sensitization paths starting from f. For a test set T, and according to one exemplary embodiment, the shortest actual path delay can be defined as:

$$HPD_f^a = \MIN_{t_i \in T_D}(HPD_f^a(t_i)), \tag{22}$$

where $T_D$ is the set of test patterns in T that detect f. When $T_D$ is empty, $HPD_f^a$ is equal to infinite.

The Holding Time Test Coverage Metric

The holding time test coverage (HTTC) metric can be used to evaluate the effectiveness of a test set at detecting holding time faults through the shortest paths. According to one exemplary nonlimiting embodiment, the HTTC can be defined as follows:

$$W_f = \frac{HPD_f^s}{HPD_f^a} \tag{23}$$

and $$HTTC = \frac{\sum_{f \in F} W_f}{N}, \tag{24}$$

where $HPD_f^a$ is the shortest static path delay through fault f; F is the set of holding time faults; and N is number of faults in F.

Exemplary Timing-Aware Test Generation Embodiments for Holding Time Violations

The test generation procedures for holding time faults are the same as the above-described test generation procedures for delay faults except that different weights used for guiding fault propagation and gate justification are used.

For fault propagation, the weight of a branch for a stem with n branches can be computed as follows:

$$w_i = \frac{\frac{1}{HPT_i^s}}{\sum_{i=1}^{n} \frac{1}{HPT_i^s}}, \tag{25}$$

where n is the number of possible fault propagation paths, i is an index value, and $HPT_i^s$ is the shortest static propagation time for the possible fault propagation path i. The probability of selecting the branch i for fault propagation is based on the weight.

For gate justification, the weight for each justification choice can be computed as follows:

$$w_i = \frac{\frac{1}{HAT_i^s}}{\sum_{i=1}^{n} \frac{1}{HAT_i^s}}, \tag{26}$$

where $HAT_i^s$ is the shortest static arrival time to the ith choice to justify the gate and n is number of choices to justify the gate. The probability of selecting the choice i for gate justification is based on the weight.

Fault Dropping Criteria for Holding Time Violations

Similar to the fault dropping criteria used for delay defects, two fault dropping criteria can be used for dropping the holding time faults from the target fault list in order to allow a tradeoff among the test generation effort, test pattern count, and test set quality for holding time defects.

The first fault dropping criterion drops a fault if the actual path delay detecting the fault is short enough. According to one exemplary embodiment, a fault f is dropped from the target fault list if a test pattern $t_i$ detects f and the shortest actual path delay created by $t_i$ satisfies the following condition:

$$\frac{HPD_f^a - HPD_f^s}{T_{TC} - HPD_f^s} < \delta, \qquad (27)$$

where $T_{TC}$ is the test clock period and $\delta$ is a real number between 0 and 1 and may be selected by the user. Other criteria based at least in part on the actual path delay can also be used.

The second fault dropping criterion drops a fault if the shortest static path delay associated with the fault is large enough. According to one exemplary embodiment, a fault f is dropped from the target fault list if a test pattern $t_i$ detects f and the shortest static path delay associated with f satisfies the following condition:

$$\frac{T_{TC} - HPD_f^s}{T_{TC}} < \lambda, \qquad (28)$$

where $\lambda$ is a real number between 0 and 1 and may be selected by the user. The two fault dropping criteria described above can be used simultaneously or separately during test pattern generation.

Exemplary Distributed Computing Network Embodiments

Figure 18:
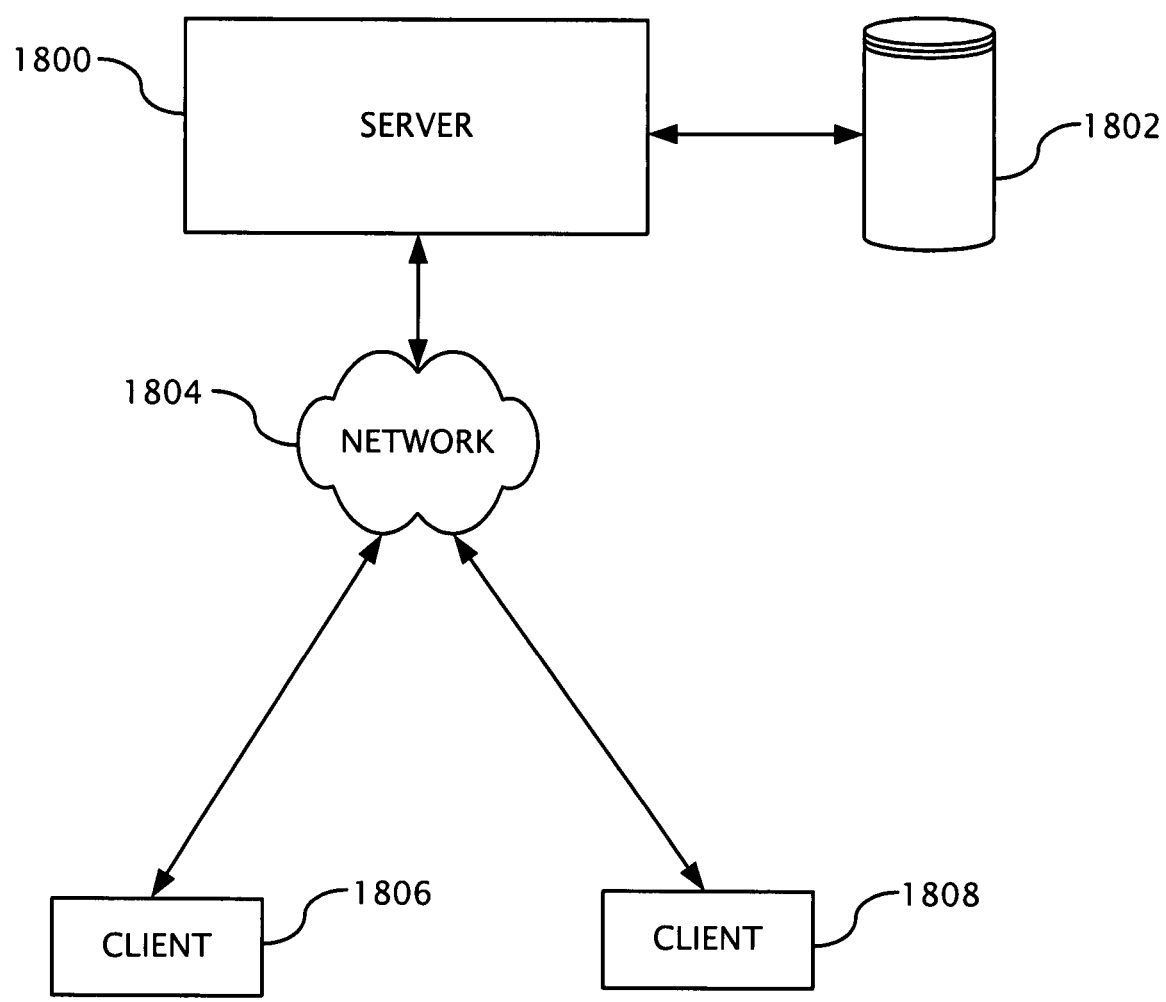
FIG. 18 is a schematic block diagram of a network as may be used to generate test patterns according to any of the disclosed embodiments.

Any of the aspects of the technology described above may be performed using a distributed computer network. FIG. 18 shows one suitable exemplary network. A server computer 1800 can have an associated storage device 1802 (internal or external to the server computer). For example, the server computer 1800 can be configured to generate test patterns or test pattern values using any of the disclosed methods (for example, as part of an EDA software tool, such as a test pattern generation tool). The server computer 1800 can be coupled to a network, shown generally at 1804, which can comprise, for example, a wide-area network, a local-area network, a client-server network, the Internet, or other suitable network. One or more client computers, such as those shown at 1806, 1808, may be coupled to the network 1804 using a network protocol. The work may also be performed on a single, dedicated workstation, which has its own memory and one or more CPUs.

Figure 19:
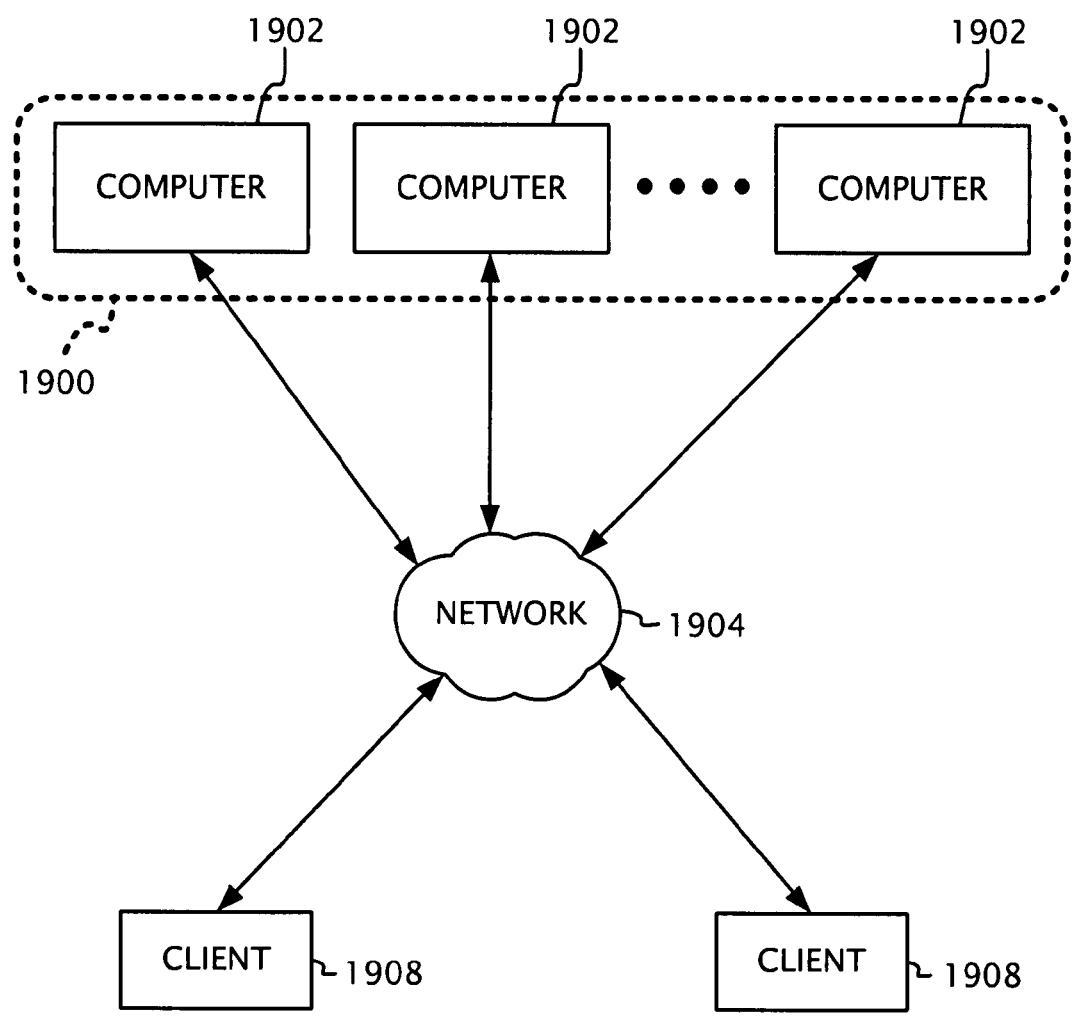
FIG. 19 is a schematic block diagram of a distributed computing network as may be used to generate test patterns according to any of the disclosed embodiments.

FIG. 19 shows another exemplary network. One or more computers 1902 communicate via a network 1904 and form a computing environment 1900 (for example, a distributed computing environment). Each of the computers 1902 in the computing environment 1900 can be used to perform at least a portion of the test pattern generation process. The network 1904 in the illustrated embodiment is also coupled to one or more client computers 1908.

Figure 20:
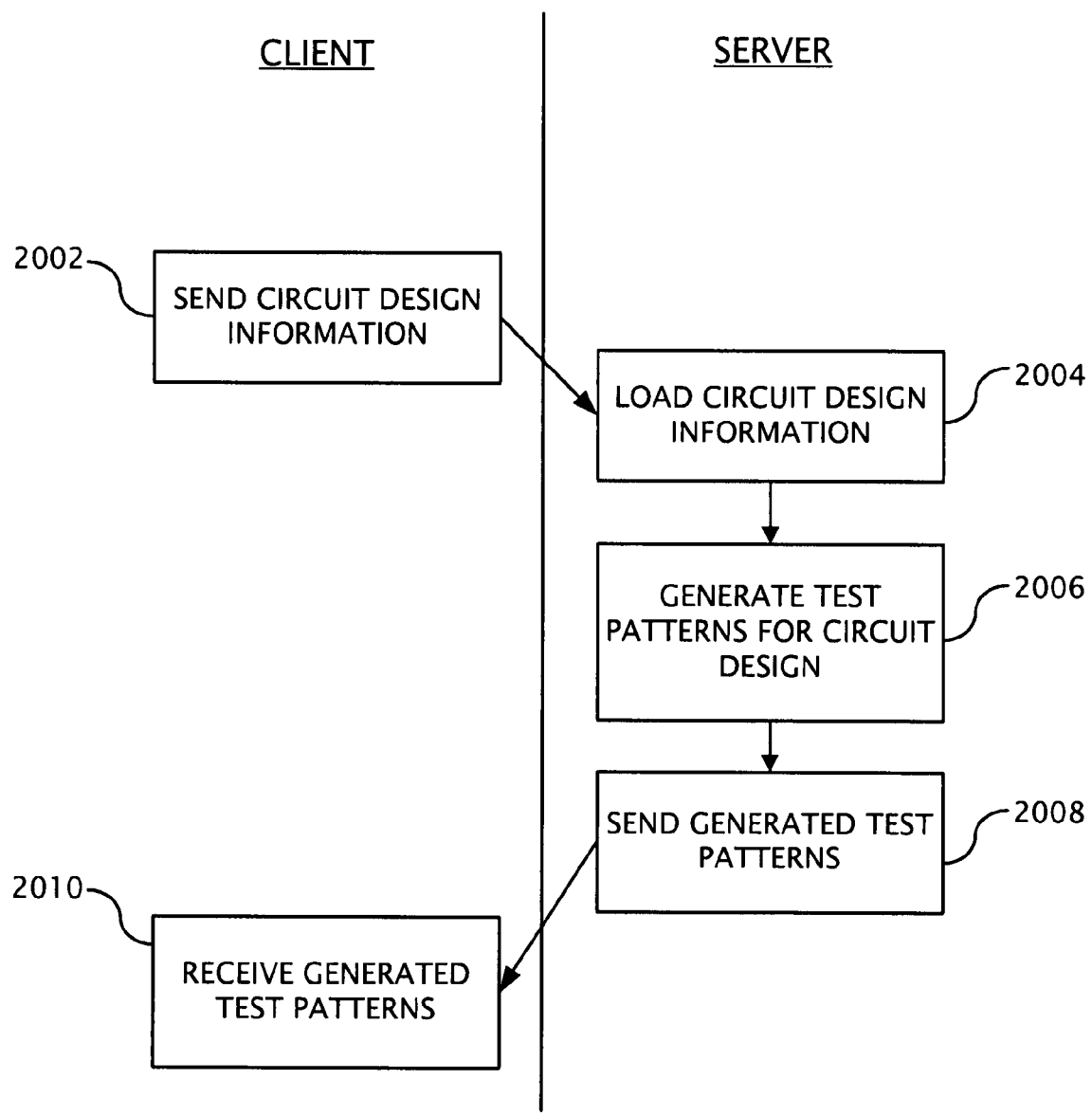
FIG. 20 is a flowchart illustrating how test patterns can be generated using the networks of FIG. 18 or FIG. 19.

FIG. 20 shows that design information for a circuit-under-test (for example, an HDL file, netlist, GDSII file, Oasis file, or other suitable design file representing the circuit-under-test together with its scan chains) can be analyzed using a remote server computer (such as the server computer 1800 shown in FIG. 18) or a remote computing environment (such as the computing environment 1900 shown in FIG. 19) in order to generate test patterns or test pattern values according to any embodiment of the disclosed technology. At process block 2002, for example, the client computer sends the integrated circuit design information to the remote server or computing environment. In process block 2004, the integrated circuit design information is received and loaded by the remote server or by respective components of the remote computing environment. In process block 2006, test pattern generation is performed to produce test patterns according to any of the disclosed embodiments. At process block 2008, the remote server or computing environment sends the resulting test patterns to the client computer, which receives the data at process block 2010.

It should be apparent to those skilled in the art that the example shown in FIG. 20 is not the only way to generate test patterns using multiple computers. For instance, the CUT design information may be stored on a computer-readable medium that is not on a network and that is sent separately to the server or computing environment (for example, a CD-ROM, DVD, or portable hard drive). Or, the server computer or remote computing environment may perform only a portion of the test pattern generation procedure.

Having illustrated and described the principles of the disclosed technology, it will be apparent to those skilled in the art that the disclosed embodiments can be modified in arrangement and detail without departing from such principles. In view of the many possible embodiments, it will be recognized that the illustrated embodiments include only examples and should not be taken as a limitation on the scope of the disclosed technology. Rather, the scope of the disclosed technology for purposes of this application is defined by the following claims and their equivalents. We therefore claim as our invention all that comes within the scope and spirit of these claims and their equivalents.

What is claimed is:

1. A method of generating test patterns for testing an integrated circuit, comprising:
identifying two or more possible fault propagation paths in an integrated circuit design, the possible fault propagation paths being capable of propagating a fault effect of a targeted slow-to-rise transition fault or slow-to-fall transition fault to an observation point in the integrated circuit design;
selecting one of the possible fault propagation paths using a weighted random selection procedure;
generating test pattern values that propagate the fault effect of the targeted slow-to-rise transition fault or slow-to-fall transition fault on the selected fault propagation path; and
storing the test pattern values.

2. The method of claim 1, wherein the weighted random selection procedure favors fault propagation paths with longer path delays over fault propagation paths with shorter path delays.

3. The method of claim 1, wherein the weighted random selection procedure favors fault propagation paths with shorter path delays over fault propagation paths with longer path delays.

4. The method of claim 1, further comprising computing weights for each of the possible fault propagation paths.

5. The method of claim 4, wherein the computed weight for a respective one of the possible fault propagation paths indicates the probability that the respective one of the possible fault propagation paths will be selected by the weighted random selection procedure.

6. The method of claim 4, wherein the act of computing weights comprises computing a weight $w_i$, for a respective possible fault propagation path i as follows:

$$w_i = \frac{PT_i^s}{\sum_{i=1}^{n} PT_i^s},$$

where n is the number of possible fault propagation paths, i is an index value, and $PT_i^s$ is the longest static propagation time for the possible fault propagation path i.

7. The method of claim 4, wherein the act of computing weights comprises computing a weight $w_i$, for a respective possible fault propagation path i as follows:

$$w_i = \frac{\frac{1}{HPT_i^s}}{\sum_{i=1}^{n} \frac{1}{HPT_i^s}},$$

where n is the number of possible fault propagation paths, i is an index value, and $HPT_i^s$ is the shortest static propagation time for the possible fault propagation path i.

8. The method of claim 1, wherein the method further comprises computing propagation times for one or more gates in the possible fault propagation paths, and wherein the weighted random selection procedure is based at least in part on the computed propagation times.

9. The method of claim 8, wherein the act of computing the propagation times comprises using timing information from an SDF file.

10. The method of claim 1, further comprising selecting a fault activation condition for activating the targeted slow-to-rise transition fault or slow-to-fall transition fault using a weighted random selection procedure that favors fault activation conditions having longer arrival times over fault activation conditions having shorter arrival times.

11. The method of claim 1, further comprising selecting a fault activation condition for activating the targeted slow-to-rise transition fault or slow-to-fall transition fault using a weighted random selection procedure that favors fault activation conditions having shorter arrival times over fault activation conditions having longer arrival times.

12. The method of claim 1, wherein the weighted random selection procedure is based at least in part on a propagation time of one of the possible fault propagation paths and a sum of propagation times of the possible fault propagation paths.

13. One or more computer-readable storage media storing test pattern values generated by a method, the method comprising:
identifying two or more possible fault propagation paths in an integrated circuit design, the possible fault propagation paths being capable of propagating a fault effect of a targeted slow-to-rise transition fault or slow-to-fall transition fault to an observation point in the integrated circuit design;
selecting one of the possible fault propagation paths using a weighted random selection procedure;
generating test pattern values that propagate the fault effect of the targeted slow-to-rise transition fault or slow-to-fall transition fault on the selected fault propagation path; and
storing the test pattern values.

14. One or more computer-readable storage media storing computer-executable instructions for causing a computer to perform a method, the method comprising:
identifying two or more possible fault propagation paths in an integrated circuit design, the possible fault propagation paths being capable of propagating a fault effect of a targeted slow-to-rise transition fault or slow-to-fall transition fault to an observation point in the integrated circuit design;
selecting one of the possible fault propagation paths using a weighted random selection procedure; and
generating test pattern values that propagate the fault effect of the targeted slow-to-rise transition fault or slow-to-fall transition fault on the selected fault propagation path.

15. The one or more computer-readable storage media of claim 14, wherein the weighted random selection procedure favors fault propagation paths with longer path delays over fault propagation paths with shorter path delays.

16. The one or more computer-readable storage media of claim 14, wherein the weighted random selection procedure favors fault propagation paths with shorter path delays over fault propagation paths with longer path delays.

17. The one or more computer-readable storage media of claim 14, wherein the method further comprises computing weights for each of the possible fault propagation paths.

18. The one or more computer-readable storage media of claim 17, wherein the computed weight for a respective one of the possible fault propagation paths indicates the probability that the respective one of the possible fault propagation paths will be selected by the weighted random selection procedure.

19. The one or more computer-readable storage media of claim 17, wherein the act of computing weights comprises computing a weight $w_i$, for a respective possible fault propagation path i as follows:

$$w_i = \frac{PT_i^s}{\sum_{i=1}^{n} PT_i^s},$$

where n is the number of possible fault propagation paths, i is an index value, and $PT_i^s$ is the longest static propagation time for the possible fault propagation path i.

20. The one or more computer-readable storage media of claim 17, wherein the act of computing weights comprises computing a weight $w_i$, for a respective possible fault propagation path i as follows:

$$w_i = \frac{\frac{1}{HPT_i^s}}{\sum_{i=1}^{n} \frac{1}{HPT_i^s}},$$

where n is the number of possible fault propagation paths, i is an index value, and $HPT_i^s$ is the shortest static propagation time for the possible fault propagation path i.

21. The one or more computer-readable storage media of claim 14, wherein the method further comprises computing propagation times for one or more gates in the possible fault propagation paths, and wherein the weighted random selection procedure is based at least in part on the computed propagation times.

22. The one or more computer-readable storage media of claim 21, wherein the act of computing the propagation times comprises using timing information from an SDF file.

23. The one or more computer-readable storage media of claim 14, wherein the method further comprises selecting a fault activation condition for activating the targeted slow-to-rise transition fault or slow-to-fall transition fault using a weighted random selection procedure that favors fault activation conditions having longer arrival times over fault activation conditions having shorter arrival times.

24. The one or more computer-readable storage media of claim 14, wherein the weighted random selection procedure is based at least in part on a propagation time of one of the possible fault propagation paths and a sum of propagation times of the possible fault propagation paths.

* * * * *